(12) United States Patent
Khalil et al.

(10) Patent No.: US 11,444,044 B2
(45) Date of Patent: Sep. 13, 2022

(54) TRANSISTOR DIE WITH OUTPUT BONDPAD AT THE INPUT SIDE OF THE DIE, AND POWER AMPLIFIERS INCLUDING SUCH DIES

(71) Applicant: NXP USA, Inc., Austin, TX (US)

(72) Inventors: Ibrahim Khalil, Gilbert, AZ (US); Ning Zhu, Chandler, AZ (US); Darrell Glenn Hill, Chandler, AZ (US); Damon G. Holmes, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 348 days.

(21) Appl. No.: 16/731,215

(22) Filed: Dec. 31, 2019

(65) Prior Publication Data
US 2021/0202408 A1   Jul. 1, 2021

(51) Int. Cl.
*H03F 3/14*   (2006.01)
*H01L 23/66*   (2006.01)
(Continued)

(52) U.S. Cl.
CPC .............. *H01L 23/66* (2013.01); *H01L 24/05* (2013.01); *H01L 24/06* (2013.01); *H01L 24/48* (2013.01);
(Continued)

(58) Field of Classification Search
CPC ......... H01L 23/66; H01L 24/05; H01L 24/06; H01L 24/48; H01L 24/49; H01L 25/16; H01L 29/0847; H01L 2223/6611; H01L 2223/6655; H01L 2223/6661; H01L 2224/04042; H01L 2224/06131; H01L 2224/48247; H01L 2224/49175; H01L 2924/19011; H01L 2924/19041; H01L 2924/19042; H01L 2924/19043; H01L 2924/30111; H01L 23/4824; H01L 23/552; H01L 24/32; H01L 24/73; H01L 24/83; H01L 2223/6677; H01L 2224/0603; H01L 2224/32245; H01L 2224/48091; H01L 2224/48111; H01L 2224/48137; H01L 2224/49111; H01L 2224/73265;
(Continued)

(56) References Cited

U.S. PATENT DOCUMENTS 9,941,227 B2   4/2018 Zhu et al.
10,707,818 B1 *  7/2020 Brech .................. H03H 7/38
(Continued)

*Primary Examiner* — Khanh V Nguyen
(74) *Attorney, Agent, or Firm* — Sherry Gourlay

(57) ABSTRACT

A power transistor die includes a semiconductor die with input and output die sides, and a transistor integrally formed in the semiconductor die between the input die side and the output die side, where the transistor has an input and an output (e.g., a gate and a drain, respectively). The power transistor die also includes an input bondpad and a first output bondpad integrally formed in the semiconductor die between the input die side and the transistor. The input bondpad is electrically connected to the input of the transistor. A conductive structure directly electrically connects the output of the transistor to the first output bondpad. A second output bondpad, which also may be directly electrically connected to the transistor output, may be integrally formed in the semiconductor die between the transistor and the output die side.

27 Claims, 8 Drawing Sheets

(51) Int. Cl.
H01L 29/08 (2006.01)
H03F 3/21 (2006.01)
H01L 23/00 (2006.01)
H01L 25/16 (2006.01)
H03F 1/02 (2006.01)
H03F 1/56 (2006.01)

(52) U.S. Cl.
CPC .............. *H01L 24/49* (2013.01); *H01L 25/16* (2013.01); *H01L 29/0847* (2013.01); *H03F 1/0288* (2013.01); *H03F 3/21* (2013.01); *H01L 2223/6611* (2013.01); *H01L 2223/6655* (2013.01); *H01L 2223/6661* (2013.01); *H01L 2224/04042* (2013.01); *H01L 2224/06131* (2013.01); *H01L 2224/48247* (2013.01); *H01L 2224/49175* (2013.01); *H01L 2924/19011* (2013.01); *H01L 2924/19041* (2013.01); *H01L 2924/19042* (2013.01); *H01L 2924/19043* (2013.01); *H01L 2924/30111* (2013.01); *H03F 1/565* (2013.01); *H03F 2200/222* (2013.01); *H03F 2200/267* (2013.01); *H03F 2200/387* (2013.01); *H03F 2200/451* (2013.01)

(58) Field of Classification Search
CPC . H01L 2224/83801; H01L 2224/83805; H01L 2224/8384; H01L 2224/8385; H01L 2924/00014; H01L 2924/0781; H01L 2924/19104; H01L 2924/19105; H03F 1/0288; H03F 3/21; H03F 1/565; H03F 2200/222; H03F 2200/267; H03F 2200/387; H03F 2200/451; H03F 3/195
See application file for complete search history.

(56) References Cited

U.S. PATENT DOCUMENTS

| | | | |
|---|---|---|---|
| 2020/0343352 A1* | 10/2020 | Trang | H01L 29/41725 |
| 2021/0050820 A1* | 2/2021 | Khalil | H03F 3/607 |
| 2021/0203278 A1* | 7/2021 | Wei | H01L 23/552 |
| 2021/0257977 A1* | 8/2021 | Cuoco | H01L 24/49 |

* cited by examiner

US 11,444,044 B2

TRANSISTOR DIE WITH OUTPUT BONDPAD AT THE INPUT SIDE OF THE DIE, AND POWER AMPLIFIERS INCLUDING SUCH DIES

TECHNICAL FIELD

Embodiments of the subject matter described herein relate generally to power transistor dies suitable for radio frequency (RF) amplifiers, and more particularly to power transistor dies that include output bondpads.

BACKGROUND

Wireless communication systems employ power amplifiers for increasing the power of radio frequency (RF) signals. In a cellular base station, for example, a Doherty power amplifier may form a portion of the last amplification stage in a transmission chain before provision of the amplified signal to an antenna for radiation over the air interface.

A typical power amplifier includes at least one power transistor implemented in a semiconductor die. When electrical connections to the semiconductor die are made using bondwires, the semiconductor die includes an input bondpad at the input side of the semiconductor die, and an output bondpad at the output side of the die. When the power transistor is a field effect transistor (FET), the input bondpad is electrically coupled to the gate terminal of the FET, and the output bondpad is electrically coupled to the drain terminal of the FET. The source terminal of the FET typically is coupled to ground. The input bondpad is configured to receive an RF signal for amplification, the power transistor is configured to amplify the input RF signal, and the output bondpad is configured to produce the amplified RF signal.

When the power amplifier die is integrated within an amplifier device and/or an amplifier system, additional input circuitry may be coupled between the amplifier input and the input bondpad (e.g., using one or more first sets of bondwires), and additional output circuitry may be coupled between the output bondpad and the amplifier output (e.g., using one or more second sets of bondwires). Amplifier and device designers continuously strive to optimize amplifier and device designs to reduce undesired electromagnetic coupling between the sets of bondwires, and to reduce the size and cost of the amplifiers and devices, without reducing amplifier performance.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
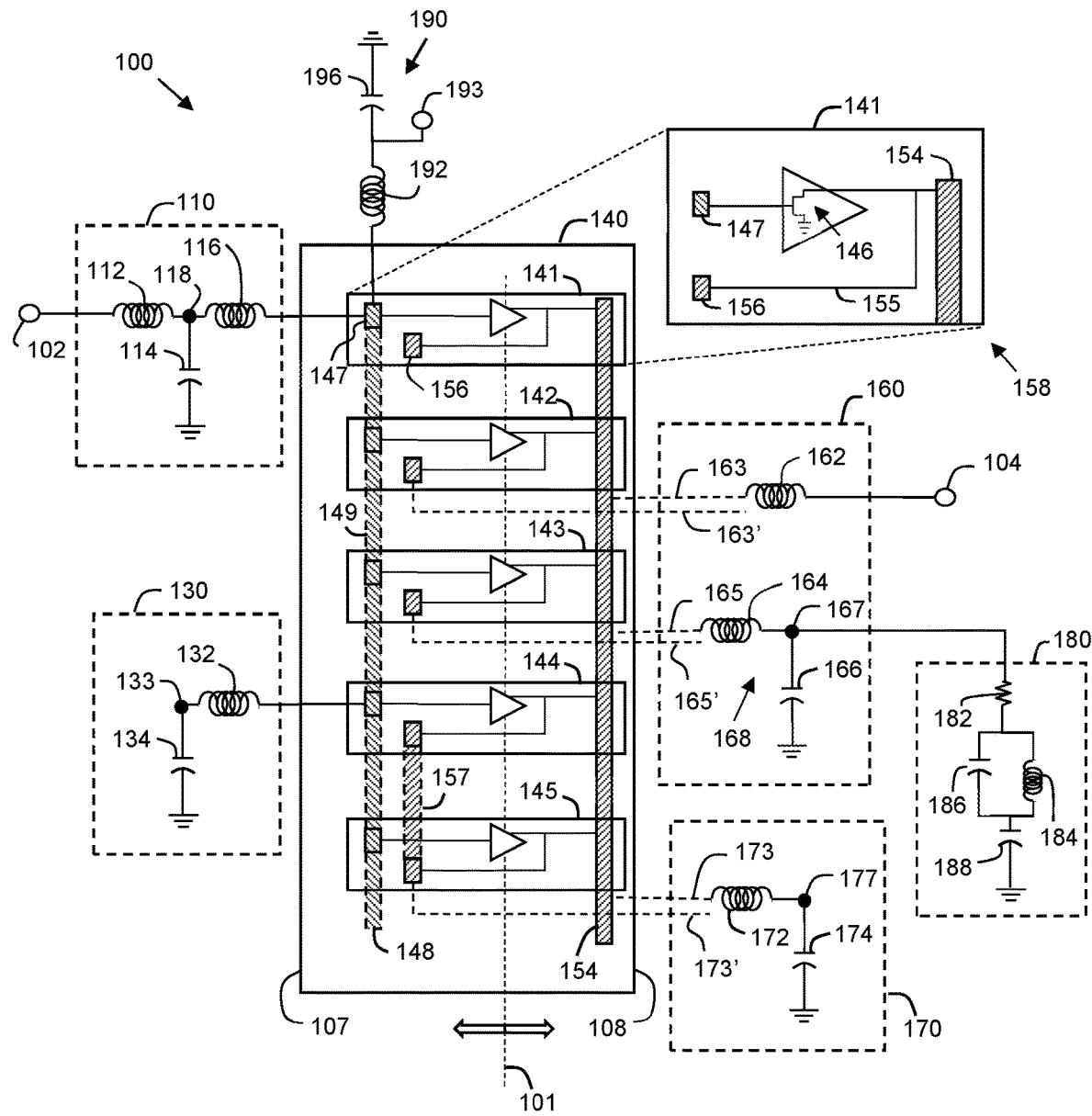
FIG. 1 is a schematic circuit diagram of a power amplifier circuit, in accordance with an example embodiment.

An embodiment of a power transistor die includes a semiconductor die with an input die side and an opposed output die side, and a transistor integrally formed in the semiconductor die between the input die side and the output die side. The transistor has an input and an output. An input bondpad is integrally formed in the semiconductor die between the input die side and the transistor, and the input bondpad is electrically connected to the input of the transistor. A first output bondpad is integrally formed in the semiconductor die between the input die side and the transistor. A conductive structure that is integrally formed in the semiconductor die directly electrically connects the output of the transistor to the first output bondpad.

In a further embodiment, the power transistor die also includes a second output bondpad integrally formed in the semiconductor die between the transistor and the output die side, where the second output bondpad is directly electrically connected to the output. In another further embodiment, the transistor is a field effect transistor, where the input is a gate of the field effect transistor, the output is a drain region of the field effect transistor, and the conductive structure includes an elongated drain contact overlying the drain region, where an input-side end of the elongated drain contact is electrically connected to the first output bondpad.

An embodiment of a field effect transistor includes a semiconductor die, a first transistor finger, a first gate bondpad, and a first input-side drain bondpad. The semiconductor die has an input die side and an opposed output die side, and the semiconductor die includes a base semiconductor substrate and a build-up structure over a top surface of the base semiconductor substrate. The first transistor finger is integrally formed in the semiconductor die between the input die side and the output die side, and the first transistor finger includes a first gate, a first drain region, and a first drain contact overlying the first drain region. The first gate extends in a first direction from the input die side toward the output die side and overlies a first channel region in the base semiconductor substrate. The first gate has a first gate end proximate to the input die side, a second gate end proximate to the output die side, and first and second gate sides extending between the first and second gate ends. The first drain region, which is in the base semiconductor substrate, extends in the first direction, and the first drain region is located adjacent to the first gate side. The first drain contact extends in the first direction, and the first drain contact has a first drain contact end proximate to the input die side, and a second drain contact end proximate to the output die side. The first gate bondpad is electrically connected to the first gate, and the first gate bondpad is integrally formed in the build-up structure between the input die side and the first transistor finger. The first input-side drain bondpad is directly electrically connected to the first drain contact, and the first input-side drain bondpad is integrally formed in the build-up structure between the input die side and the first transistor finger.

According to a further embodiment, the first input-side drain bondpad is directly connected to the first drain contact end through conductive structures that are integrally formed in the semiconductor die. According to another further embodiment, the field effect transistor also includes an output-side drain bondpad directly connected to the second drain contact end, where the output-side drain bondpad is integrally formed in the build-up structure between the first transistor finger and the output die side. According to yet another further embodiment, the field effect transistor also includes a second transistor finger integrally formed in the semiconductor die between the input die side and the output die side. The second transistor finger includes a second gate extending in the first direction and overlying a second channel region in the base semiconductor substrate, a second drain region extending in the first direction, where the second drain region is located adjacent to the second gate, and a second drain contact overlying the second drain region and extending in the first direction, where the second drain contact is directly connected to the output-side drain bondpad. According to yet another further embodiment, the field effect transistor also includes a plurality of additional transistor fingers arranged in parallel with the first transistor finger, where the plurality of additional transistor fingers includes a plurality of additional gates, a plurality of additional drain regions, and a plurality of additional drain contacts. According to yet another further embodiment, the field effect transistor also includes a plurality of additional gate bondpads, each integrally formed in the semiconductor die and electrically connected to one or more of the plurality of additional gates, and a plurality of additional input-side drain bondpads, each directly electrically connected to one or more of the additional drain contacts, where the plurality of additional input-side drain bondpads are formed in the build-up structure between the input die side and the plurality of additional transistor fingers. According to yet another further embodiment, the first and additional gate bondpads are positioned in an alternating arrangement with the first and additional input-side drain bondpads. According to yet another further embodiment, the field effect transistor also includes a conductive input runner electrically coupled to the first gate bondpad, the first gate, and the plurality of additional gates, where the conductive input runner is positioned between the first gate bondpad and the first gate finger, and a plurality of additional gate bondpads, each integrally formed in the semiconductor die and electrically connected to the conductive input runner. According to yet another further embodiment, the field effect transistor also includes a plurality of additional input-side drain bondpads each directly electrically connected to one or more of the additional drain contacts, where the plurality of additional input-side drain bondpads are formed in the semiconductor build-up structure between the input die side and the plurality of additional transistor fingers. According to yet another further embodiment, the field effect transistor also includes a source region in the base semiconductor substrate and extending in the first direction, where the source region is located adjacent to the second gate side, and the source region is electrically coupled to a conductive layer on a bottom surface of the semiconductor die. According to yet another further embodiment, the field effect transistor also includes a second transistor finger integrally formed in the semiconductor die between the input die side and the output die side, where the first transistor finger is located at a first side of the source region, the second transistor finger is located at a second side of the source region. The second transistor finger includes a second gate extending in the first direction and overlying a second channel region in the base semiconductor substrate, where the second gate is electrically connected to the first gate bondpad, a second drain region extending in the first direction, where the second drain region is located adjacent to the second gate, and a second drain contact overlying the second drain region and extending in the first direction. The field effect transistor also includes a second input-side drain bondpad directly electrically connected to the second drain contact, where the second input-side drain bondpad is formed in the build-up structure between the input die side and the second transistor finger, and the first gate bondpad is located between the first and second input-side drain bondpads.

An embodiment of a power amplifier includes an amplifier substrate, an amplifier input coupled to the amplifier substrate, an amplifier output coupled to the amplifier substrate, and a transistor die coupled to the amplifier substrate. The transistor die includes a semiconductor die with an input die side and an opposed output die side, a transistor integrally formed in the semiconductor die between the input die side and the output die side, where the transistor has an input and an output, an input bondpad integrally formed in the semiconductor die between the input die side and the transistor, where the input bondpad is electrically connected to the input of the transistor, a first output bondpad integrally formed in the semiconductor die between the input die side and the transistor, and a conductive structure integrally formed in the semiconductor die that directly electrically connects the output of the transistor to the first output bondpad. The power amplifier also includes an output circuit electrically coupled between the transistor and the amplifier output, where the output circuit includes at least one first bondwire coupled to the first output bondpad.

According to a further embodiment, the at least one first bondwire includes a plurality of bondwires with first ends connected to the first output bondpad, and second ends connected to the amplifier output. According to another further embodiment, the output circuit includes at least one passive device that is coupled to the amplifier substrate, and the at least one first bondwire includes a plurality of bondwires with first ends connected to the first output bondpad, and second ends connected to the at least one passive device. According to yet another further embodiment, the at least one passive device is coupled to the amplifier substrate between the transistor die and the amplifier output. According to yet another further embodiment, the at least one passive device is coupled to the amplifier substrate between the transistor die and the amplifier input. According to yet another further embodiment, the transistor die further includes a second output bondpad integrally formed in the semiconductor die between the transistor and the output die side, and the output circuit includes at least one passive device, which is coupled to the amplifier substrate, and at least one second bondwire coupled to the second output bondpad. According to yet another further embodiment, the at least one first bondwire includes a plurality of first bondwires with first ends connected to the first output bondpad, and second ends connected to the at least one passive device, and the at least one second bondwire includes a plurality of second bondwires with first ends connected to the second output bondpad, and second ends connected to the amplifier output. According to yet another further embodiment, the at least one first bondwire includes a plurality of first bondwires with first ends connected to the first output bondpad, and second ends connected to the amplifier output, and the at least one second bondwire includes a plurality of second bondwires with first ends connected to the second output bondpad, and second ends connected to the at least one passive device. According to yet another further embodiment, the output circuit further includes a capacitor with a first terminal coupled to the at least one first bondwire, and a second terminal electrically coupled to a ground reference node, where the capacitor is a DC blocking capacitor. According to yet another further embodiment, the power amplifier also includes a baseband termination circuit electrically connected to a connection node between the at least one first bondwire and the capacitor, where the baseband termination circuit includes an envelope resistor, an envelope inductor, and an envelope capacitor coupled in series between the connection node and the ground reference node. According to yet another further embodiment, the output circuit further includes a capacitor with a first terminal coupled to the at least one first bondwire, and a second terminal electrically coupled to a ground reference node, where the at least one first bondwire and the capacitor form a series inductor/capacitor (LC) circuit that resonates at or near a second harmonic frequency.

According to yet another further embodiment, the amplifier input, the transistor die, the amplifier output, and the output circuit form portions of a first amplification path, and the power amplifier further includes a second amplification path, a power divider, and a combining node. The power divider has a divider input configured to receive a radio frequency (RF) signal, a first divider output coupled to an input of the first amplification path, and a second divider output coupled to an input of the second amplification path. The power divider is configured to divide the RF signal into a first RF signal that is provided to the first amplification path through the first divider output, and into a second RF signal that is provided to the second amplification path through the second divider output. The combining node is configured to receive and combine amplified RF signals produced by the first and second amplification paths. According to yet another further embodiment, the power amplifier is a Doherty power amplifier.

A conventional power transistor die includes an input bondpad at an input side of the die, and an output bondpad at the output side of the die. The input bondpad is connected to an input circuit positioned between an amplifier input and the input side of the die, and the output bondpad is connected to an output circuit positioned between the output side of the die and an amplifier output. In many cases, the output circuit includes multiple distinct bondwire arrays coupled to the output bondpad, and these bondwire arrays may have undesirable electromagnetic coupling during operation.

As indicated above, embodiments of power transistor die described herein include an output bondpad positioned between the input die side and the transistor. As will be discussed in detail below, embodiments of power transistor die disclosed herein enable a variety of alternative power amplifier designs, which may have one or more advantages over conventional designs. These advantages may include smaller, more compact amplifiers and/or reduced electromagnetic coupling between bondwire arrays.

FIG. 1 is a schematic circuit diagram of a power amplifier circuit 100, in accordance with an example embodiment. Circuit 100 includes an input 102 (e.g., a first conductive package lead), an input impedance matching circuit 110, an input-side harmonic termination circuit 130, a transistor 140, an output impedance matching circuit 160, an output-side harmonic termination circuit 170, a baseband termination circuit 180, and an output lead 104 (e.g., a second conductive package lead), in an embodiment. Each of the input and output 102, 104 may be more generally referred to as an "RF input/output (I/O)."

The input impedance matching circuit 110 and the harmonic termination circuit 130 may be referred to collectively as an "input circuit." Similarly, the output impedance matching circuit 160, the harmonic termination circuit 170, and the baseband termination circuit 180 may be referred to collectively as an "output circuit." Although transistor 140 and various elements of the input and output impedance matching circuits 110, 160, the baseband termination circuit 180, and the harmonic termination circuits 130, 170 are shown as singular components, the depiction is for the purpose of ease of explanation only. Those of skill in the art would understand, based on the description herein, that transistor 140 and/or certain elements of the input impedance matching circuit 110, the input-side harmonic termination circuit 130, the output impedance matching circuit 160, the output-side harmonic termination circuit 170, and the baseband termination circuit 180 each may be implemented as multiple components (e.g., connected in parallel or in series with each other). Further, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 140 and various elements of the input impedance matching circuit 110, the input-side harmonic termination circuit 130, the output impedance matching circuit 160, the output-side harmonic termination circuit 170, and the baseband termination circuit 180, below, thus are not intended to limit the scope of the inventive subject matter only to the illustrated embodiments.

Input 102 and output 104 each may include a conductor, which is configured to enable the circuit 100 to be electrically coupled with external circuitry (not shown). More specifically, the input and output 102, 104 are physically positioned to span between the exterior and the interior of an amplifier module or an amplifier device package. Input impedance matching circuit 110 and input-side harmonic termination circuit 130 are electrically coupled between the input 102 and an input terminal 148 of transistor 140. As will be described in more detail below, output impedance matching circuit 160, output-side harmonic termination circuit 170, and baseband termination circuit 180 are electrically coupled between an output terminal 158 of transistor 140 of transistor 140 and the output 104.

According to an embodiment, transistor 140 is the primary active component of circuit 100. In some embodiments, transistor 140 includes a plurality of transistor fingers 141, 142, 143, 144, 145 electrically connected in parallel between an input side 107 and an opposed output side 108 of the transistor 140. For purposes of explanation, a transistor centerline 101 is shown to be located between and in parallel with the input and output sides 107, 108 of the transistor (and more particularly extending through the transistor fingers 141-145 of transistor 140). As used herein, the "input side" of the transistor 140 includes portions of transistor 140 located to the left of the input centerline 101, and the "output side" of transistor 140 includes portions of transistor 140 located to the right of the input centerline 101. Although FIG. 1 depicts only five transistor fingers 141-145, those of skill in the art would understand, based on the description herein, that transistor 140 may include fewer transistor fingers (including as few as one finger) or more transistor fingers (including up to 50 or more fingers).

As will be described in more detail later in conjunction with FIG. 3, each finger 141-145 of transistor 140 includes a transistor 146, which further includes a control terminal and two current conducting terminals, where the current conducting terminals are spatially and electrically separated by a variable-conductivity channel. For example, the transistor 146 of each finger 141-145 may be a field effect transistor (FET), which includes a control terminal in the form of a gate, and current conducting terminals in the form of a drain and a source, respectively. According to an embodiment, and using nomenclature typically applied to FETs in a non-limiting manner, the gate of each transistor 146 is coupled to the input impedance matching circuit 110 and the input-side harmonic termination circuit 130, the drain of each transistor 146 is coupled to the output impedance matching circuit 160, the output-side harmonic termination circuit 170, and the baseband termination circuit 180, and the source of each transistor 146 is coupled to a ground reference node (or another voltage reference). Through the variation of control signals provided to the gate of the transistor 146, the current between the current conducting terminals of the transistor 146 may be modulated.

According to various embodiments, each transistor 146 may be a III-V field effect transistor (e.g., a high electron mobility transistor (HEMT)), such as a gallium nitride (GaN) based FET. In other embodiments, each transistor 146 may be another type of III-V transistor (e.g., gallium arsenide (GaAs), gallium phosphide (GaP), indium phosphide (InP), or indium antimonide (InSb) transistor), a silicon-based FET (e.g., a laterally diffused metal oxide semiconductor (LDMOS) FET), or another type of transistor.

Input impedance matching circuit 110 is coupled between the input 102 and the input terminal 148 of the transistor 140. As will be discussed in more detail later in conjunction with FIGS. 2, 5, and 6, the input terminal 148 may include a plurality of bondpads 147 (e.g., bondpads 247, 547, 647, FIGS. 2, 5, 6), all of which (or groups of which) are electrically coupled together through one or more conductive "input runners" 149 (e.g., input runners 249, 549, 649, FIGS. 2, 5, 6). Input impedance matching circuit 110 is configured to raise the impedance of circuit 100 to a higher (e.g., intermediate or higher) impedance level (e.g., in a range from about 2 to about 10 Ohms or higher).

According to an embodiment, input impedance matching circuit 110 has a T-match topology, which includes two inductive elements 112, 116 (e.g., two sets of bondwires) and a shunt capacitance 114. A first inductive element 112 (e.g., a first set of bondwires) is coupled between input 102 and a node 118, which in turn is coupled to a first terminal of capacitor 114, and a second inductive element 116 (e.g., a second set of bondwires) is coupled between the node 118 (or the first terminal of capacitor 114) and the input terminal 148 of transistor 140. The second terminal of capacitor 114 is coupled to a ground reference node (or another voltage reference). The combination of inductive elements 112, 116 and shunt capacitance 114 functions as a low-pass filter. According to an embodiment, the series combination of inductive elements 112, 116 may have an inductance value in a range between about 50 picohenries (pH) to about 3 nanohenries (nH), and shunt capacitance 114 may have a capacitance value in a range between about 5 picofarads (pF) to about 120 pF. In some embodiments, shunt capacitance 114 may have a relatively-large capacitance (e.g., greater than about 60 pF) to provide an acceptable RF low-impedance point.

In addition, an input-side harmonic termination circuit 130 is coupled between the input terminal 148 of transistor 140 and a ground reference node (or another voltage reference). Harmonic termination circuit 130 includes inductive element 132 (e.g., a third set of bondwires) and capacitance 134 coupled in series between the input terminal 148 of transistor 140 and the ground reference node, with a node 118 between the inductive element 132 and the capacitance 134. According to an embodiment, values for the inductive element 132 and the capacitance 134 are selected so that the harmonic termination circuit 130 is resonant at or near a second harmonic frequency, 2f0, for the circuit 100 (i.e., about twice the fundamental frequency of operation, f0). Essentially, the series combination of elements 132, 134 function as a low impedance path to ground for signal energy at the second harmonic frequency, 2f0. According to an embodiment, inductive element 132 may have an inductance value in a range between about 50 pH to about 3 nH, and capacitance 134 may have a capacitance value in a range between about 0.1 pF to about 50 pF, although these components may have values outside of these ranges, as well.

According to various embodiments, which will be discussed in more detail later in conjunction with FIGS. 2, 5, and 6, the output terminal 158 may include first and second output bondpads 154, 156. More specifically, one or more first output bondpads 154 (e.g., bondpads 254, 554, 654, FIGS. 2, 5, 6) are located at the output side of transistor 140 (i.e., to the right of centerline 101) between the transistors 146 and the output side 108 of transistor 140, and one or more second output bondpads 156 (e.g., bondpads 256, 556, 656, FIGS. 2, 5, 6) are located at the input side of transistor 140 (i.e., to the left of centerline 101) between the input side 107 of transistor 140 and the transistors 146. The first and second output bondpads 154, 156 are electrically coupled together through conductive structures 155 (e.g., an elongated drain contact, the drain fingers, 255, 555, 655, FIGS. 2, 5, 6), which transcend the transistor centerline 101 (or which extend in a direction from the output side 108 toward the input side 107). Accordingly, conductive structures 155 may be considered to be conductive "output terminal-to-bondpad structures". In some embodiments, some or all of the second output bondpads 156 may be electrically coupled together through one or more conductive "output terminal runners" 157 (e.g., runners 257, FIG. 2). In other embodiments, the output bondpads 156 are not electrically connected through an output terminal runner 157 (e.g., in the embodiments illustrated in FIGS. 5, 6).

On the output side of the circuit 100, output impedance matching circuit 160 is coupled between the output terminal 158 of transistor 140 and the output 104. According to an embodiment, the output impedance matching circuit 160 includes an output inductance 162 (e.g., a fourth set of bondwires), and a shunt inductance (or shunt-L) circuit 168 coupled between the output terminal 158 of transistor 140 and a ground reference node. The output impedance matching circuit 160 is configured to match the output impedance of circuit 100 with the input impedance of an external circuit or component (not shown) that may be coupled to output 104.

In some embodiments, as indicated by dashed connector 163, the inductive element 162 may be coupled between the output-side output bondpad 154 and the output 104, whereas in other embodiments, as indicated by dashed connector 163', the inductive element 162 alternatively may be coupled between the input-side output bondpad 156 and the output 104. According to an embodiment, inductive element 162 may have an inductance value in a range between about 0.1 nH and about 4 nH, although inductive element 162 may have a value outside of this range, as well.

Further, in some embodiments, as indicated by dashed connector 165, the shunt-L circuit 168 may be coupled between the output-side output bondpad 154 and the ground reference node, whereas in other embodiments, as indicated by dashed connector 165', the shunt-L circuit 168 alternatively may be coupled between the input-side output bondpad 156 and the ground reference node. Shunt-L circuit 168 includes inductive element 164 (e.g., a fifth set of bondwires) and capacitance 166 coupled in series between the output terminal 158 of transistor 140 and the ground reference node, with a connection node 167 between the inductive element 164 and the capacitance 166. Capacitance 166 may be a DC blocking capacitor, in an embodiment. According to an embodiment, inductive element 164 may have an inductance value in a range between about 0.1 nH to about 40 nH, capacitance 166 may have a capacitance value in a range between about 2 pF to about 300 pF, although these components may have values outside of these ranges, as well. As will be described in more detail later in conjunction with FIGS. 7-10, the capacitance 166, may be integrally-formed with or coupled to an integrated passive device (IPD), such as IPD 720, 820, 1010, FIGS. 7-10.

Connection node 167 may correspond to an RF low-impedance point (or an RF "cold point") at the fundamental frequency of operation, f0 of the amplifier 100. According to an embodiment, a baseband termination circuit 180 is coupled between the connection node 167 (or the RF cold point node) and the ground reference node. The baseband termination circuit 180 may function to improve the low frequency resonance (LFR) of circuit 100 by presenting a low impedance at envelope frequencies and/or a high impedance at RF frequencies. Baseband termination circuit 180 essentially may be considered to be "invisible" from an RF matching standpoint.

Although the baseband termination circuit 180 may have any of a number of different circuit configurations, the illustrated embodiment of baseband termination circuit 180 includes a series-coupled combination of an envelope resistance 182, parallel inductor/capacitor (LC) circuit (including envelope inductance 184 and capacitance 186), and envelope capacitance 188. More specifically, a first terminal of envelope resistance 182 is coupled to node 167, and a second terminal of envelope resistance 182 is coupled to first terminals of envelope inductance 184 and capacitance 186. Second terminals of envelope inductance 184 and capacitance 186 are coupled to a first terminal of envelope capacitance 188, and a second terminal of envelope capacitance 188 is coupled to a ground reference node.

Parallel-coupled inductance 184 and capacitance 186 form a parallel resonant circuit at frequencies in proximity to the center operational frequency of the circuit 100 (e.g., within 20 percent of the center operating frequency). Because inductance 184 and capacitance 186 form a parallel resonant circuit at frequencies in proximity to the center operational frequency of the circuit 100, the parallel resonant circuit comprising inductance 184 and capacitance 186 essentially appears as an open circuit to such frequencies. Accordingly, RF energy near the center operational frequency that may be present at the connection node 167 will be reflected by the parallel resonant circuit comprising inductance 184 and capacitance 186. This reflection may be provided even using a relatively low inductance value for inductance 184. For this reason, 180 may significantly improve the LFR of circuit 100 by presenting a low impedance at envelope frequencies and a high impedance at RF frequencies.

According to an embodiment, envelope resistance 182 may have a resistance value in a range between about 0.1 ohm to about 5.0 ohm, although envelope resistance 182 may have a resistance value outside of this range, as well. Envelope inductance 184 may have an inductance value in a range between about 5 pH to about 2000 pH. Desirably, envelope inductance 184 has an inductance value less than about 500 pH (e.g., as low as 50 pH, in an embodiment, or possibly even lower). Capacitance 186 may have a capacitance value in a range between about 3.0 pF to about 200 pF, although capacitance 186 may have a capacitance value outside of this range, as well. Envelope capacitance 188 may have a capacitance value in a range between about 0.5 nanofarad (nF) to about 1 microfarad (µF), although envelope capacitance 188 may have a capacitance value outside of this range, as well.

In baseband termination circuit 180, although a particular order of the series of components between node 167 and the ground reference node is shown in FIG. 1, the order of components in the circuit could be different, in other embodiments. Either way, as will be described in more detail later in conjunction with FIGS. 7-10, the envelope resistance 182, envelope inductance 184, capacitance 186, and envelope capacitance 188, may be integrally-formed with or coupled to an IPD, such as IPD 720, 820, 1010, FIGS. 7-10.

In addition to the above-described output circuitry, an output-side harmonic termination circuit 170 also may be coupled between the output terminal 158 of transistor 140 and a ground reference node (or another voltage reference). In some embodiments, as indicated by dashed connector 173, the output-side harmonic termination circuit 170 more specifically is coupled between the output-side output bondpad 154 and the ground reference node, whereas in other embodiments, as indicated by dashed connector 173', the output-side harmonic termination circuit 170 is more specifically coupled between an input-side output bondpad 156 and the output 104.

Output-side harmonic termination circuit 170 includes inductive element 172 (e.g., a sixth set of bondwires) and capacitance 174 coupled in series between the output terminal 158 of transistor 140 and the ground reference node, with a node 177 between the inductive element 172 and the capacitance 174. According to an embodiment, values for the inductive element 172 and the capacitance 174 are selected so that the harmonic termination circuit 170 is resonant at or near the second harmonic frequency, 2f0, for the circuit 100. Essentially, the series combination of elements 172, 174 function as a low impedance path to ground for signal energy at the second harmonic frequency, 2f0. According to an embodiment, inductive element 172 may have an inductance value in a range between about 50 pH to about 3 nH, and capacitance 174 may have a capacitance value in a range between about 0.1 pF to about 50 pF, although these components may have values outside of these ranges, as well. As will be described in more detail later in conjunction with FIGS. 7-10, the capacitance 174, may be integrally-formed with or coupled to an IPD, such as IPD 720, 820, 1010, FIGS. 7-10.

In various embodiments, amplifier circuit 100 also may include bias circuitry, such as gate bias circuit 190. Bias circuit 190 includes an inductive element 192 and a capacitor 196 connected in series, with an intermediate node 193 between the inductor/capacitor pair. To provide a bias voltage to the input terminal 148 of the transistor 140, an external bias circuit (not shown) may be connected to node 193, and the bias voltage may be provided through this node. In other embodiments, the input-side bias circuit 190 may be excluded, and/or an output-side bias circuit (not shown) may be included.

The RF amplifier circuit 100 of FIG. 1 may be utilized as a single-path amplifier, which receives an RF signal at input 102, amplifies the signal through transistor 140, and produces an amplified RF signal at output 104. Alternatively, as will be described in more detail later in conjunction with FIGS. 7 and 11, multiple instances of the RF amplifier circuit 100 may be utilized to provide a multiple-path amplifier, such as a Doherty power amplifier or another type of multi-path amplifier circuit.

Figure 2:
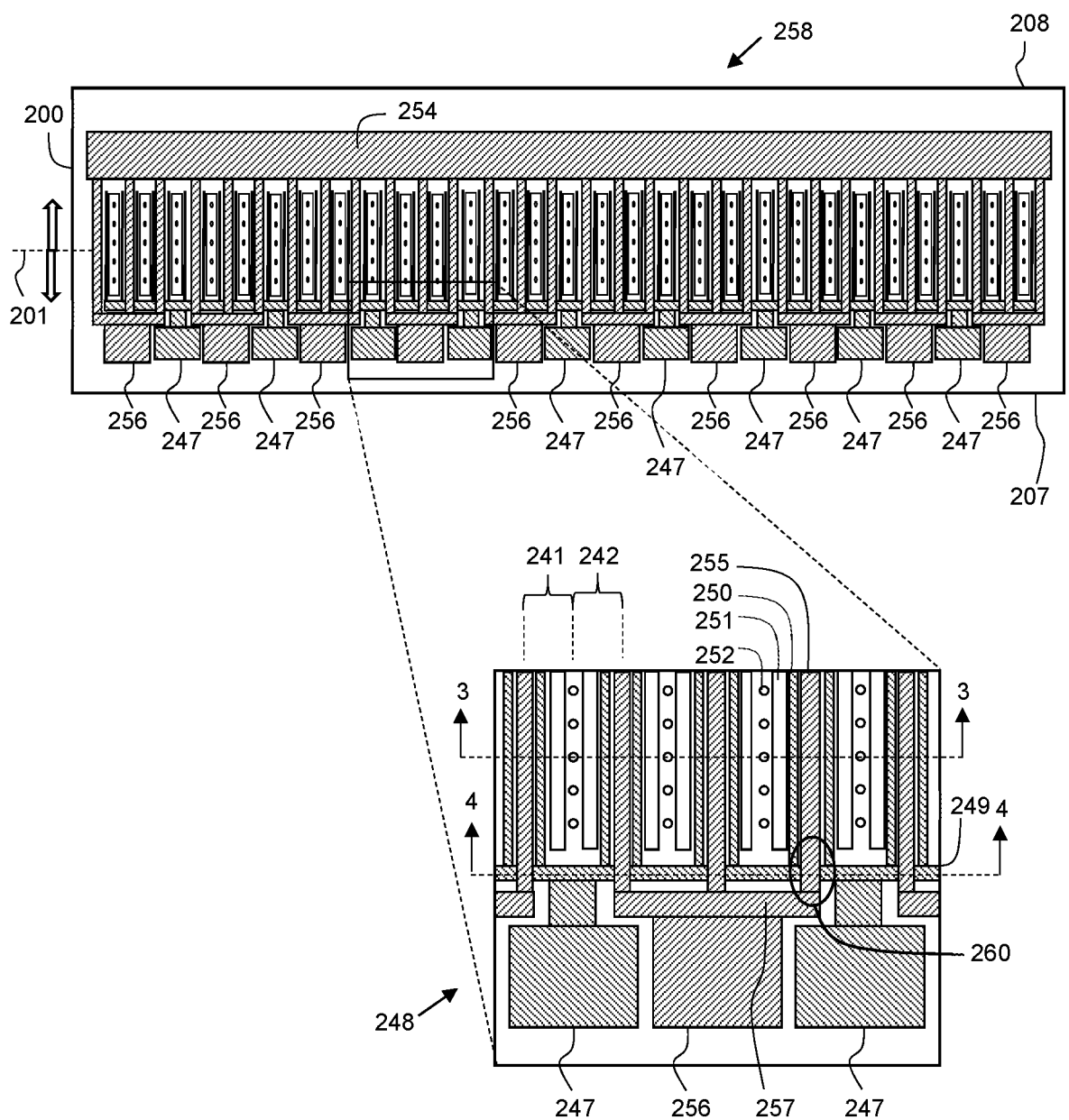
FIG. 2 is a top view of a power transistor die, in accordance with an example embodiment.
Figure 3:
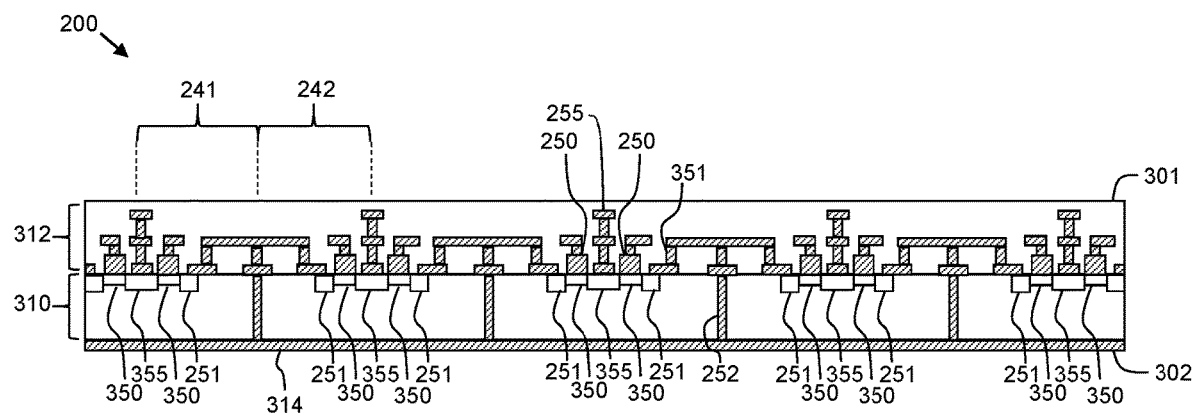
FIGS. 3 and 4 are cross-sectional, side views of the power transistor die of FIG. 2 along lines 3-3 and 4-4, respectively, in accordance with an example embodiment.
Figure 4:
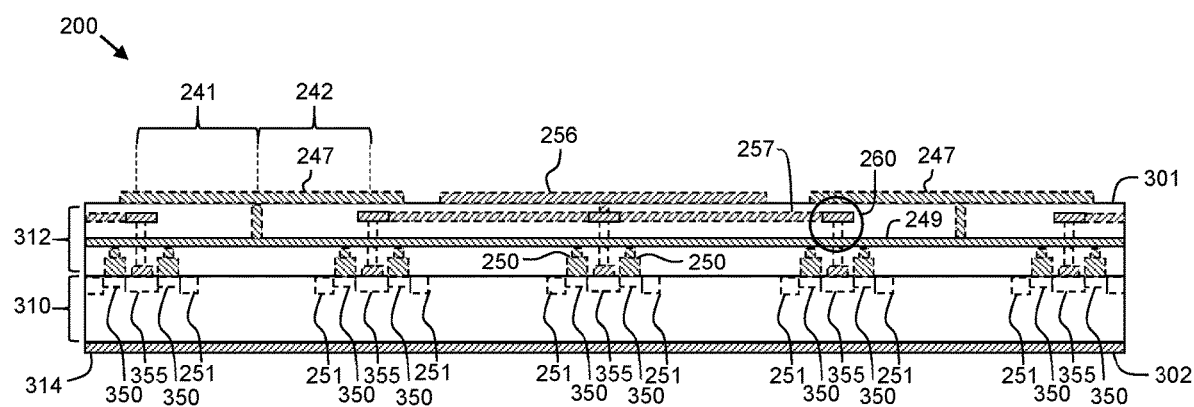

Embodiments of a power transistor die corresponding to transistor 140 will now be described in conjunction with FIGS. 2-4, where FIG. 2 is a top view of a power transistor die 200, and FIGS. 3 and 4 are cross-sectional, side views of the power transistor die 200 of FIG. 2 along lines 3-3 and 4-4, respectively, in accordance with an example embodiment. A portion of the input side of transistor die 200 is shown enlarged in FIG. 2 to better illustrate various features of the die 200.

Transistor die 200 is a monolithic semiconductor device, in an embodiment. More specifically, the components of transistor die 200 form portions of a single semiconductor die. Referring to FIGS. 3 and 4, transistor die 200 includes a base semiconductor substrate 310 and a build-up structure 312, where the build-up structure 312 includes a plurality of dielectric and patterned conductive layers and structures on and over a top surface of the base semiconductor substrate 310. The top surface of the build-up structure 312 defines the top surface 301 of die 200. According to an embodiment, a conductive layer 314 is formed on a bottom surface of the base semiconductor substrate 310 to define the bottom surface 302 of die 200.

The conductive layer 314 also functions as a ground reference node for the die 200. As used herein, a "ground reference node" means a conductive feature that is integrally-formed with the semiconductor die 200, and which is configured to be electrically coupled to an external conductive feature which, in turn, may be electrically coupled to a ground reference voltage. Thus, although not shown in FIGS. 2-4, when the transistor die 200 ultimately is packaged or incorporated into a larger system, the conductive layer 314 may be physically and electrically coupled to a ground node of a package or system substrate (e.g., flange 706, FIG. 7). In other embodiments, the "ground reference node" may be an integrally-formed conductive feature of die 200 other than conductive layer 314 (e.g., the ground reference node may be a bondpad, the end(s) of one or more conductive vias, or other integrally-formed conductive features).

According to an embodiment, the base semiconductor substrate 310 is a gallium nitride (GaN) based substrate, such as a GaN substrate, a GaN on silicon substrate, a GaN on silicon carbide substrate, and so on. In other embodiments, the base semiconductor substrate 310 may be a silicon-based substrate (e.g., silicon, silicon on insulator, and so on). In some embodiments, the base semiconductor substrate 310 is a high-resistivity silicon substrate (e.g., a silicon substrate having bulk resistivity in a range of about 500 ohm-centimeter (cm) to about 100,000 ohm-cm or greater). Alternatively, the base semiconductor substrate 310 may be a semi-insulating gallium arsenide (GaAs) substrate (e.g., a GaAs substrate having bulk resistivity up to $10^8$ ohm-cm), or another suitable high-resistivity substrate. An advantage to the use of a high-resistivity substrate is that such a substrate may enable various on-die circuitry to exhibit relatively low losses, when compared with transistor dies that do not utilize a high-resistivity substrate. In still other alternate embodiments, the base semiconductor substrate 310 may be any of multiple variants of a silicon-based substrate, a silicon-germanium substrate, another type of III-V semiconductor substrate, or some other type of semiconductor substrate.

The build-up structure 312 may include, for example, a plurality of alternating dielectric and patterned conductive layers, along with other conductive structures (e.g., conductive polysilicon structures). Within build-up structure 312, portions of different patterned conductive layers and conductive structures are electrically coupled with conductive vias. In addition, conductive through substrate vias (TSVs) (e.g., TSV 252) may provide conductive paths between the top and bottom surfaces of the base semiconductor substrate 310. The TSVs may or may not be lined with dielectric material to insulate the TSVs from the base semiconductor substrate 310.

The transistor die 200 has an input die side 207, an opposed output die side 208, and a plurality of transistor fingers (e.g., fingers 241, 242) in an active area between the input and output die sides 207, 208. The transistor fingers 241, 242 are arranged side-by-side and directly adjacent to each other, where "adjacent" means positioned next to, and "directly adjacent" means positioned next to without significant electrical or non-electrical components or structures therebetween.

As most clearly depicted in FIG. 3, each transistor finger 241, 242 corresponds to a small field effect transistor (FET) that includes a gate 250 (or control terminal) overlying a variably-conductive channel region 350 in the base semiconductor substrate 310, a drain region 355 in the base semiconductor substrate 310 located adjacent to a first side of the gate 250 (or adjacent to a first side of the channel region 350), and a source region 251 in the base semiconductor substrate 310 located adjacent to a second side of the gate 250 (or to adjacent to as second side of the channel region 350).

Each drain region 355 and source region 251 includes a doped semiconductor region formed in the base semiconductor substrate 310. The channel region 350 (and, in some embodiments, a drain drift region) is present between adjacent source and drain regions 251, 355. The source regions 251 are electrically coupled to conductive (e.g., polysilicon or metal) source contacts 351, which in turn are coupled to conductive TSVs (e.g., TSV 252, FIGS. 2, 3) that extend through the base semiconductor substrate (e.g., substrate 310) to connect with the conductive layer (e.g., layer 314) on the bottom surface of the base semiconductor substrate 310. As mentioned previously, the conductive layer 314 may function as a ground reference node, and thus the source regions 251 may be electrically coupled to ground through the source contacts 315 and the TSVs 252. During operation, voltages applied to the gates 250 modulate the conductivity of the variably-conductive channel regions 350, thus enabling current flow between source and drain regions 251, 355 (or ultimately between conductive layer 314 and each drain terminal 355).

In various embodiments, each transistor finger 241, 242 may correspond to a metal-oxide-semiconductor FET (MOSFET), a laterally-diffused MOSFET (LDMOS FET), an enhancement-mode or depletion-mode high electron mobility transistor (HEMT), or another type of FET. According to various embodiments, each of the transistor fingers 241, 242 may be implemented, for example, using a silicon-based FET, a silicon-germanium (SiGe) based FET, or a III-V FET (e.g., a HEMT), such as a GaN FET (or another type of III-V transistor, including a GaAs FET, a gallium phosphide (GaP) FET, an indium phosphide (InP) FET, or an indium antimonide (InSb) FET).

As evident in the top view of FIG. 2, each transistor finger 241, 242 has an elongated active area in which a length of the finger (i.e., a dimension extending along an axis between the input and output die sides 207, 208) is significantly larger than a width of the finger (i.e., a dimension extending along an axis that is perpendicular to the length). For example, the finger lengths may be in a range of about 50 microns to about 1200 microns, and the finger widths may be in a range of about 0.1 microns to about 0.4 microns. In other embodiments, the finger lengths and widths may be smaller or larger than the above-given ranges.

The gates 250, channel regions 350, drain regions 355, and source regions 251 all extend in parallel with each other in a direction from the input die side 207 toward the output die side 208. According to an embodiment, each of the gates 250, channel regions 350, drain regions 355, and source regions 251 transcend a transistor centerline 201 (e.g., centerline 101, FIG. 1), and accordingly each of the gates 250, channel regions 350, drain regions 355, and source regions 251 have a first end proximate to the input side 207 of the die 200, and a second end proximate to the output side 208 of the die 200.

The gates 250 include conductive (e.g., polysilicon or metal) structures that are formed in the build-up structure 312 over the top surface of the base semiconductor substrate 310. Each gate 250 extends over and along the length of a channel region 350, and each gate 250 is electrically connected (e.g., through conductive vias and patterned conductive layers in build-up structure 312) to an input terminal 248 of the die 200 (e.g., input terminal 148, FIG. 1).

According to an embodiment, the input terminal 148 includes a plurality of input bondpads 247 (also referred to as "gate bondpads"), and a conductive "input runner" 249 (also referred to as a "gate runner"). Each input bondpad 247 is exposed at the top surface 301 of the die 200, and is integrally formed in the build-up structure 312 between the input die side 207 and the transistor fingers 241, 242 (or the transistors/active area of the die 200). As is most clearly illustrated in FIG. 4, the input runner 249 also is formed in the build-up structure 312, and is located between the input bondpads 247 and the transistor fingers 241, 242. An end of each gate 250 that is closest to the input die side 207 is electrically coupled to the input bondpads 247 through the input runner 249.

Conductive (e.g., polysilicon) drain contacts 255, which overly and extend along the lengths of the drain regions 355, also are formed in the build-up structure 312 over the top surface of the base semiconductor substrate 310. As will be explained in more detail below, first and/or second ends of each drain contact 255 are electrically coupled to an output terminal 258 of the die 200 (e.g., output terminal 158, FIG. 1) through conductive structures (e.g., conductive vias and traces in the build-up structure 312) that are electrically connected to the first and second drain contact ends. As used herein, the term "drain contact" includes both the elongated conductive contact that overlies the drain regions 355, and the conductive structures that electrically connect the elongated conductive contact with the output terminal 258. As used herein, each drain contact 255 may be considered to be a conductive "output terminal-to-bondpad structure".

According to an embodiment, the output terminal 258 includes an output-side output bondpad 254 (also referred to as an "output-side drain bondpad") and a plurality of input-side output bondpads 256 (also referred to as "input-side drain bondpads"). The output-side output bondpad 254 is exposed at the top surface 301 of the die 200, and is integrally formed in the build-up structure 312 between the transistor fingers 241, 242 (or the transistors/active area of the die 200) and the output die side 208. In other words, the output-side output bondpad 254 is located at the output side of transistor die 200 (i.e., above the centerline 201). The input-side output bondpads 256 also are exposed at the top surface 301 of the die 200, and are integrally formed in the build-up structure 312 between the input die side 207 and the transistor fingers 241, 242 (or the transistors/active area of the die 200). In other words, the input-side output bondpads 256 are located at the input side of transistor die 200 (i.e., below the centerline 201).

According to an embodiment, first ends of the plurality of drain contacts 255 are electrically coupled to the input-side output bondpads 256, and second ends of the plurality of drain contacts 255 are electrically coupled to the output-side output bondpad 254. In other words, the drain contacts 255 function as conductive structures (e.g., conductive structures 155, FIG. 1) that electrically couple the output-side and input-side output bondpads 254, 256, in an embodiment. In an alternate embodiment, one or more separate conductive structures that are distinct from the drain contacts 255 may be used to electrically couple the drain contacts 255 and the output-side and input-side output bondpads 254, 256. Either way, the conductive structures (e.g., the drain contacts 255 or other conductive structures) extend between the output and input sides 208, 207 of the die 200, and they transcend the transistor centerline 201 (e.g., centerline 101, FIG. 1).

As more clearly shown in FIGS. 2 and 4, subsets of adjacent drain contacts 255 may be electrically coupled to the input-side output bondpads 256 through conductive output runners 257 (e.g., runners 157, FIG. 1), which are formed in the build-up structure 312. For example, in the embodiment of FIG. 2, each subset of three adjacent drain contacts 255 is electrically coupled together to an input-side output bondpad 256 with an output runner 257. More specifically, the ends of three adjacent drain contacts 255 that are closest to the input die side 207 are electrically coupled to a single input-side output bondpad 256 through an output runner 257. By coupling together multiple adjacent drain contacts 255 in the above-described manner, the width of the input-side output bondpads 256 may be made relatively large, which enables more bondwires to be coupled to each of the input-side output bondpads 256 than would be practical for narrower bondpads, and/or may enable greater spacing between input signal bondwires coupled to the input bondpads 247 and output signal bondwires coupled to the input-side output bondpads 256. This may increase ease of manufacturing and/or may result in less electromagnetic coupling between the input and output signal bondwires.

In the embodiment illustrated in FIG. 2, the input bondpads 247 and the input-side output bondpads 256 are aligned with each other and positioned in an alternating arrangement along an axis that is parallel with the input side 207 of the die 200. In an alternate embodiment, the input bondpads 247 may be aligned along a first axis (and/or may be merged into a single elongated input bondpad), and the input-side output bondpads 256 may be aligned along a second axis (and/or may be merged into a single elongated input-side output bondpad), where the first and second axes are offset from each other in the vertical direction of FIG. 2.

Either way, the configuration of the power transistor die 200 in FIG. 2 is advantageous over conventional power transistor dies, because the configuration of the drain contacts 255 and the output terminal 258 enable output/drain connections to be made from the output side 208 of the die 200 (through output-side output bondpad 254) and/or from the input side 207 of the die 200 (through input-side output bondpads 256). As will be illustrated and explained in more detail in conjunction with FIGS. 7-10, this feature of power transistor die 200 enables a variety of different amplifier designs that may have reduced electromagnetic coupling between output bondwire arrays, and/or that may have fewer components and more compact footprints.

As shown in encircled region 260 (FIGS. 2, 4) portions of the input runner 249 and the drain contacts 255 (or the conductive structures that electrically connect the output-side and input-side output bondpads 254, 256) may overlap each other in certain areas within the build-up structure 312. Along with the dielectric material between the overlapping portions of the input runner 249 and drain contact 255, this essentially forms a capacitive structure between the drain and gate, which may result in a small amount of parasitic gate-drain capacitance, Cgd, within these regions 260. As will be described in more detail in conjunction with FIGS. 5 and 6, this parasitic gate-drain capacitance may be avoided by eliminating overlaps between the input runner 249 and the drain contacts 255 (or the other conductive structures that electrically connect the output-side and input-side output bondpads 254, 256).

Figure 5:
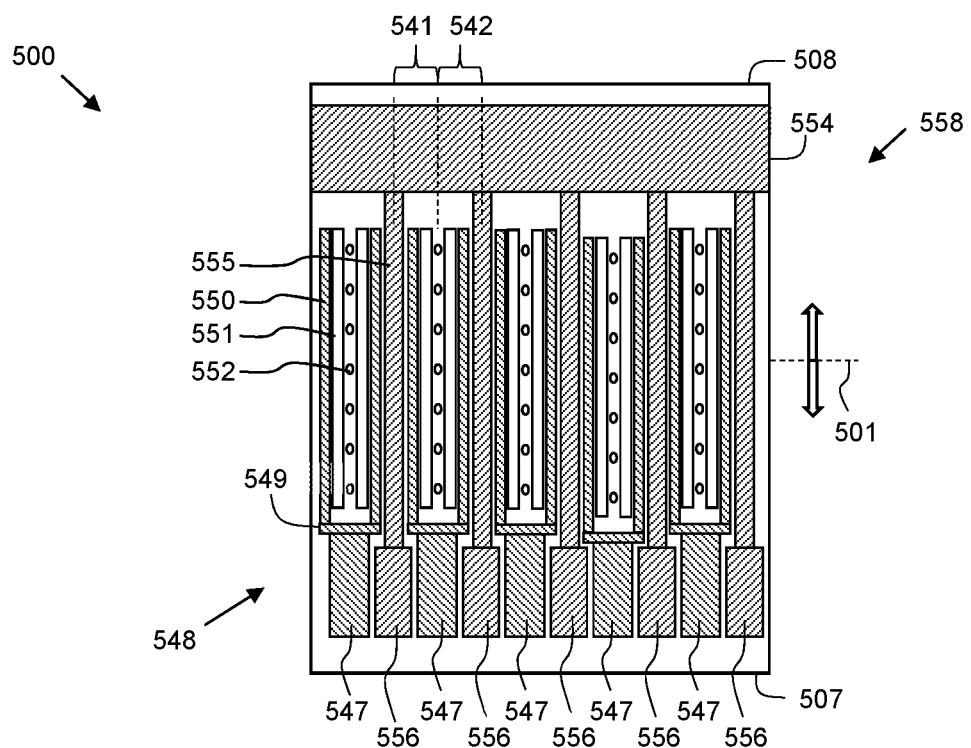
FIG. 5 is a top view of a power transistor die, in accordance with another example embodiment.

For example, FIG. 5 is a top view of a power transistor die 500, in accordance with another example embodiment, in which overlaps between the gate-contacting and drain-contacting structures have been eliminated. Power transistor die 500 is similar to power transistor die 200 (FIG. 2) in that power transistor die 500 also has a base semiconductor substrate (e.g., base semiconductor substrate 310, FIG. 3), a build-up structure overlying the base semiconductor substrate (e.g., similar to build-up structure 312, FIG. 3, with differences noted below), an input die side 507, an opposed output die side 508, and a plurality of transistor fingers (e.g., fingers 541, 542) in an active area between the input and output die sides 507, 508. Further, each of the transistor fingers 541, 542 includes a gate 550 (overlying a channel region, such as channel region 350, FIG. 3), a drain contact 555 (overlying a drain region, such as drain region 355, FIG. 3), and a source region 551, all of which extend in parallel with each other in a direction from the input die side 507 toward the output die side 508, transcending a transistor centerline 501 (e.g., centerline 101, FIG. 1). Each drain contact 555 may be considered to be a conductive "output terminal-to-bondpad structure". The output contact 558 includes an output-side output bondpad 554 coupled to ends of the drain contacts 555 that are closest to the output die side 508, and a plurality of input-side output bondpads 556 that are proximate to the input die side 507 and electrically coupled to opposite ends of the drain contacts 555. Further still, a plurality of input bondpads 547 (also proximate to the input die side 507) corresponding to an input terminal 548 are electrically connected to the gates 550, and the input-side output bondpads 556 are positioned in an alternating arrangement with the input bondpads 547 along an axis that is parallel with the input side 507. For purposes of brevity, the details regarding these common features, which are described in detail above in conjunction with FIG. 2, are not repeated here. However, those details are intended to be incorporated into this description of power transistor die 500.

The primary differences between the power transistor die 500 of FIG. 5 and the power transistor die 200 of FIG. 2 are in the configurations of and electrical connections to the input bondpads 547 and the input-side output bondpads 556. More specifically, each input-side output bondpad 556 is electrically connected to the end of a single drain contact 555, rather than being electrically connected to multiple drain contacts (e.g., through an output runner 257, FIG. 2), as is implemented in transistor die 200. In addition, all of the input bondpads 547 and gates 550 are not electrically coupled across the width of the device (e.g., through a single input runner 249, FIG. 2). Instead, only pairs of gates 550 that are adjacent to each other without an intervening drain contact 555 are electrically coupled together with shorter input runners 549. These electrically-connected pairs of gates 550 are included in transistor fingers (e.g., fingers 541, 542) that share a common source-to-ground connection (e.g., through TSVs 552).

As can be seen in FIG. 5, the relatively-short input runners 549 do not overlap any portions of the drain contacts 555. In other words, there are no overlapping portions of the input runner 549 and the drain contacts 555 within the build-up structure of the die 500. Accordingly, parasitic gate-drain capacitance may be reduced in the power transistor die 500, in comparison with the power transistor die 200 (FIG. 2).

Such reductions in parasitic gate-drain capacitance also may be accomplished in other ways, as well. For example, FIG. 6 is a top view of a power transistor die 600, in accordance with yet another example embodiment. Again, power transistor die 600 is similar to power transistor die 200 (FIG. 2) in that power transistor die 600 also has a base semiconductor substrate (e.g., base semiconductor substrate 310, FIG. 3), a build-up structure overlying the base semiconductor substrate (e.g., similar to build-up structure 312, FIG. 3, with differences noted below), an input die side 607, an opposed output die side 608, and a plurality of transistor fingers (e.g., fingers 641, 642) in an active area between the input and output die sides 607, 608. Further, each of the transistor fingers 641, 642 includes a gate 650 (overlying a channel region, such as channel region 350, FIG. 3), a drain contact 655, 655' (overlying a drain region, such as drain region 355, FIG. 3), and a source region 651, all of which extend in parallel with each other in a direction from the input die side 607 toward the output die side 608, transcending a transistor centerline 601 (e.g., centerline 101, FIG. 1). Each drain contact 655 may be considered to be a conductive "output terminal-to-bondpad structure". The output contact 658 includes an output-side output bondpad 654 coupled to ends of the drain contacts 655, 655' that are closest to the output die side 608, and a plurality of input-side output bondpads 656 that are proximate to the input die side 607 and electrically coupled to opposite ends of some of the drain contacts 655. Further still, a plurality of input bondpads 647 (also proximate to the input die side 607) corresponding to an input terminal 648 are electrically connected to the gates 650, and the input-side output bondpads 656 are positioned in an alternating arrangement with the input bondpads 647 along an axis that is parallel with the input side 607. For purposes of brevity, the details regarding these common features, which are described in detail above in conjunction with FIG. 2, are not repeated here. However, those details are intended to be incorporated into this description of power transistor die 600.

Figure 6:
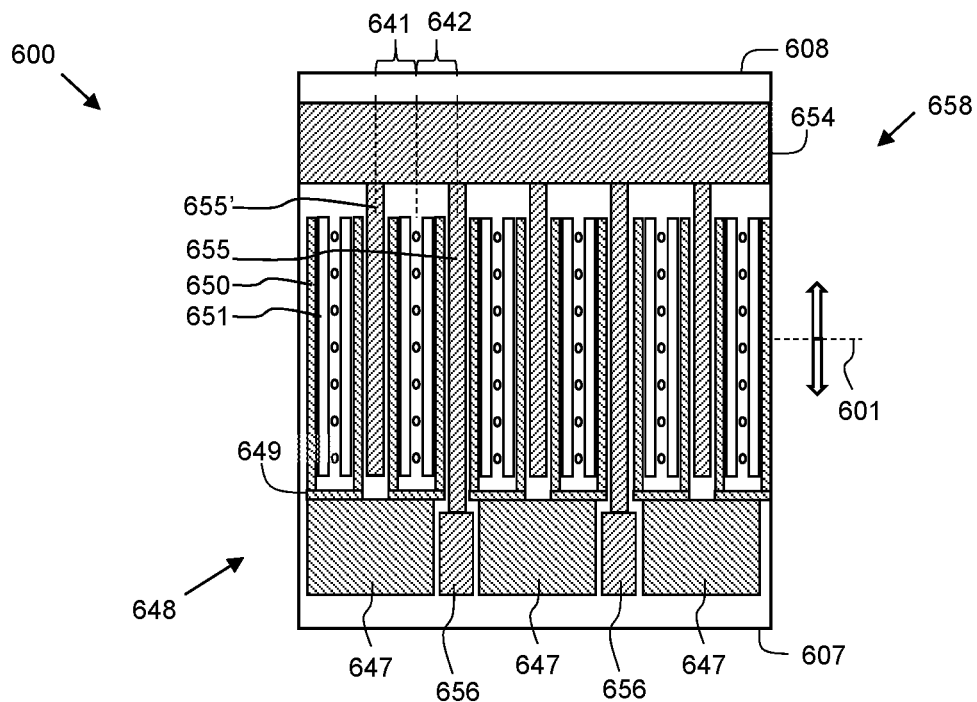
FIG. 6 is a top view of a power transistor die, in accordance with yet another example embodiment.

Again, the primary differences between the power transistor die 600 of FIG. 6 and the power transistor die 200 of FIG. 2 are in the configurations of and electrical connections to the input bondpads 647 and the input-side output bondpads 656. More specifically, each input-side output bondpad 656 is electrically connected to the end of a single drain contact 655, rather than being electrically connected to multiple drain contacts (e.g., through an output runner 257, FIG. 2), as is implemented in transistor die 200. In addition, however, some of the drain contacts 655' are coupled only to the output-side output bondpad 654, without being coupled to an input-side output bondpad 656. In the embodiment of FIG. 6, for example, all of the drain contacts 655, 655' are coupled at one end to the output-side output bondpad 654, but only every other drain contact 655 is coupled at the other end to an input-side output bondpad 656. In addition, once again, all of the input bondpads 647 and gates 650 are not electrically coupled across the width of the device (e.g., through a single input runner 249, FIG. 2). Instead, only sets of gates 650 that are adjacent to each other without an intervening drain contact 655 are electrically coupled together with shorter input runners 649. That said, pairs of gates 650 that have only an intervening drain contact 655' are electrically coupled to a single input bondpad 647 (through input runners 649), while still avoiding a configuration in which portions of the input runners 649 and the drain contacts 655, 655' overlap.

As can be seen in FIG. 6, once again, the relatively-short input runners 649 do not overlap any portions of the drain contacts 655, 655'. In other words, there are no overlapping portions of the input runner 649 and the drain contacts 655, 655' within the build-up structure of the die 600. However, by including the single-end-connected drain contacts 655', more gates 650 may be electrically coupled together at the input side 607 of the die 600, thus enabling wider input bondpads 647 to be implemented, in comparison with the input bondpads 547 of die 500. Accordingly, parasitic gate-drain capacitance may be reduced in the power transistor die 600, in comparison with the power transistor die 200 (FIG. 2), while increasing the number of bondwires that may be coupled to each of the input bondpads 647 (and/or increasing the spacing between input signal bondwires and output signal bondwires), in comparison with the power transistor die 500 (FIG. 5). This may increase ease of manufacturing and/or may result in less electromagnetic coupling between the input and output signal bondwires.

Figure 7:
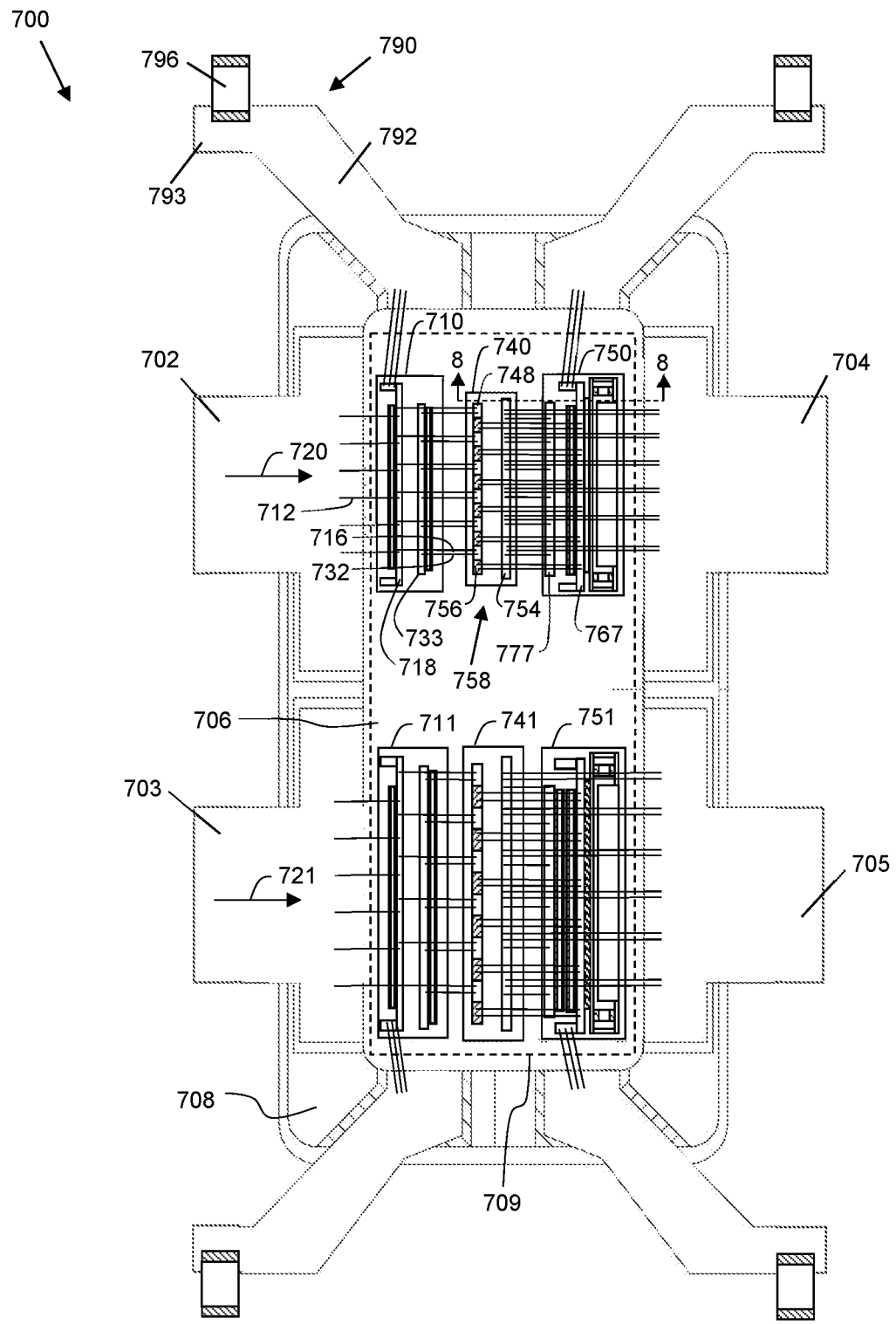
FIG. 7 is a top view of a packaged RF power amplifier device that includes two parallel amplification paths, in accordance with an example embodiment.
Figure 8:
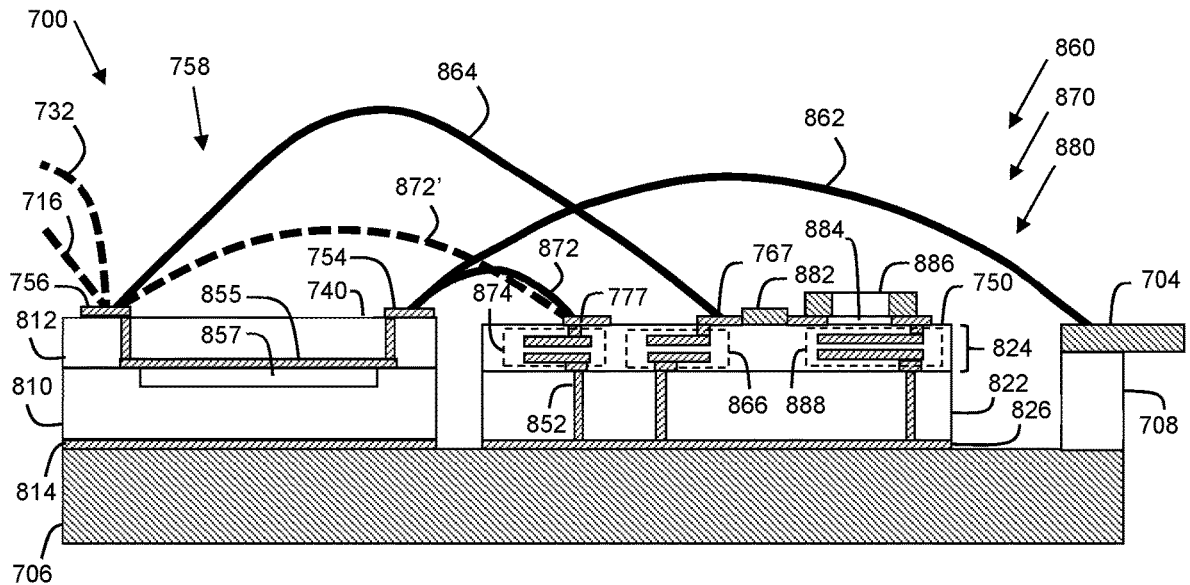
FIG. 8 is a cross-sectional, side view of a portion of the packaged RF power amplifier device of FIG. 7, including a power transistor die and an output impedance matching circuit, in accordance with an example embodiment.
Figure 9:
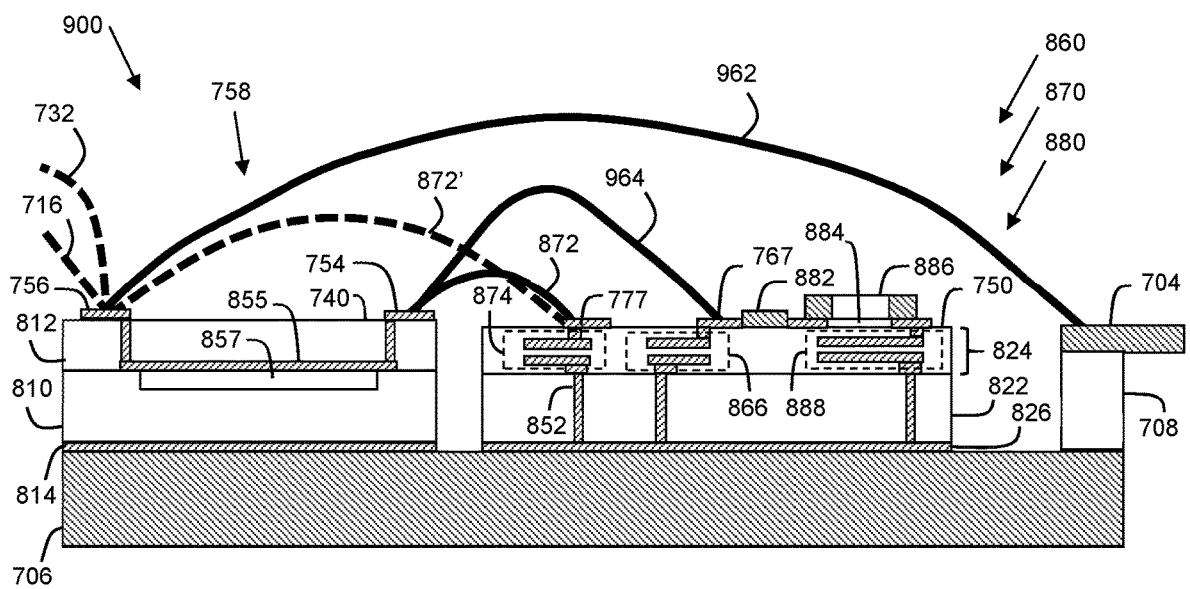
FIG. 9 is a cross-sectional, side view of a portion of a packaged RF power amplifier device, including a power transistor die and an output impedance matching circuit, in accordance with another example embodiment.

The transistor dies 200, 500, 600 described above may be incorporated into an amplifier device, module, or system, and the configuration of the output contacts 258, 558, 658 enable unique amplifier configurations, as will be described below in conjunction with FIGS. 7-10. For example FIG. 7 is a top view of an embodiment of a packaged RF amplifier device 700 that embodies two parallel instances of the circuit 100 of FIG. 1, including two power transistor dies 740, 741 that may have any of the configurations of dies 200, 500, 600 (FIGS. 2-6), as previously described above. For enhanced understanding, FIG. 7 should be viewed simultaneously with FIG. 8, which is a cross-sectional, side view through a portion of device 700 along line 8-8 in FIG. 7. FIG. 9 is a cross-sectional, side view through a similar portion of a device 900, according to an alternate embodiment, and to the extent that device 900 is different from device 700, those differences will be called out below. Otherwise, device 900 and its various components should be considered to be substantially identical to device 700 depicted in FIGS. 7 and 8. In FIGS. 7-9, the same reference numbers are used to represent substantially identical elements.

In addition, as will be described in more detail below, device 700 includes two input-side integrated passive device (IPD) assemblies 710, 711, each of which includes portions of an input impedance matching circuit (e.g., circuit 110, FIG. 1), and an input-side harmonic termination circuit (e.g., circuit 130, FIG. 1). Further, device 700 includes two output-side IPD assemblies 750, 751, each of which includes portions of an output impedance matching circuit (e.g., circuit 160, FIG. 1), a baseband termination circuit (e.g., circuit 180, FIG. 1), and an output-side harmonic termination circuit (e.g., circuit 170, FIG. 1).

Device 700 includes a flange 706 (or "device substrate"), in an embodiment, which includes a rigid electrically-conductive substrate with a thickness that is sufficient to provide structural support for various electrical components and elements of device 700. In addition, flange 706 may function as a heat sink for transistor dies 740, 741 and other devices mounted on flange 706. Flange 706 has top and bottom surfaces (only a central portion of the top surface is visible in FIG. 7), and a substantially-rectangular perimeter that corresponds to the perimeter of the device 700.

Flange 706 is formed from an electrically conductive material, and may be used to provide a ground reference node for the device 700. For example, various components and elements may have terminals or features (e.g., conductive layers 814, 826, FIG. 8) that are electrically coupled to flange 706, and flange 706 may be electrically coupled to a system ground when the device 700 is incorporated into a larger electrical system. At least the top surface of flange 706 is formed from a layer of conductive material, and possibly all of flange 706 is formed from bulk conductive material.

An isolation structure 708 is attached to the top surface of flange 706, in an embodiment. Isolation structure 708, which is formed from a rigid, electrically insulating material, provides electrical isolation between conductive features of the device (e.g., between leads 702-705, 792 and flange 706). Isolation structure 708 has a frame shape, in an embodiment, which includes a substantially enclosed, four-sided structure with a central opening. Isolation structure 708 may have a substantially rectangular shape, as shown in FIG. 7, or isolation structure 708 may have another shape (e.g., annular ring, oval, and so on).

A portion of the top surface of flange 706 that is exposed through the opening in isolation structure 708 is referred to herein as the "active area" of device 700. Transistor dies 740, 741 are positioned within the active device area of device 700, along with IPD assemblies 710, 711, 750, 751, which will be described in more detail later. For example, the transistor dies 740, 741 and IPD assemblies 710, 711, 750, 751 may be coupled to the top surface of flange 706 using conductive epoxy, solder, solder bumps, sintering, and/or eutectic bonds.

Device 700 houses two amplification paths (indicated with arrows 720, 721), where each amplification path 720, 721 represents a physical implementation of amplifier circuit 100 (FIG. 1). As will be explained in more detail later in conjunction with FIG. 11, when device 700 is incorporated into a Doherty amplifier (e.g., Doherty amplifier 1100, FIG. 11), amplification path 720 may correspond to a main amplifier path (e.g., main amplifier path 1120, FIG. 11), and amplification path 721 may correspond to a peaking amplifier path (e.g., peaking amplifier path 1121, FIG. 11).

Each path 720, 721 includes an input lead 702, 703 (e.g., input 102, FIG. 1), an output lead 704, 705 (e.g., output 104, FIG. 1), one or more transistor dies 740, 741 (e.g., transistor 140 or any of dies 200, 500, 600, FIGS. 1-6), an input impedance matching circuit (e.g., input impedance matching circuit 110, FIG. 1), an output impedance matching circuit (e.g., output impedance matching circuit 160, FIG. 1), an output-side baseband termination circuit (e.g., baseband termination circuit 180, FIG. 1), an input-side harmonic termination circuit (e.g., harmonic termination circuit 130, FIG. 1), and an output-side harmonic termination circuit (e.g., harmonic termination circuit 170, FIG. 1). In addition, although not discussed in detail below, device 700 may include bias circuitry (e.g., gate bias circuit 790) to provide gate and/or drain bias voltages to the gates and/or drains of the transistors within the transistor dies 740, 741. For example, bias circuit 790 (e.g., bias circuit 190, FIG. 1) includes a set of bondwires and a bias lead 792 (e.g., corresponding to inductive element 192, FIG. 1) electrically coupled to the input terminal 748 of transistor die 740, along with a shunt-coupled capacitor 796 (e.g., corresponding to capacitor 196, FIG. 1). To provide a gate bias voltage to the input terminal 748 of the transistor die 740, an external bias circuit (not shown) may be connected to the distal end 793 (e.g., corresponding to node 193, FIG. 1) of the bias lead 792, and the gate bias voltage may be provided through the bias lead 792. Additional gate and drain bias voltages similarly may be provided through the additional bias leads (not numbered).

The input and output leads 702-705 are mounted on a top surface of the isolation structure 708 on opposed sides of the central opening, and thus the input and output leads 702-705 are elevated above the top surface of the flange 706, and are electrically isolated from the flange 706. Generally, the input and output leads 702-705 are oriented to allow for attachment of bondwires between the input and output leads 702-705 and components and elements within the central opening of isolation structure 708.

The transistor dies 740, 741 each may correspond to one of transistor dies 200, 500, 600 (FIGS. 2-6). Accordingly, referring also to FIG. 8, each transistor die 740, 741 includes a base semiconductor substrate 810 (e.g., substrate 310, FIG. 3), a build-up structure 812 (e.g., build-up structure 312, FIG. 3) over the base semiconductor substrate 810, and an integrated power transistor formed in the base semiconductor substrate 810 and the build-up structure 812. Each transistor has an input terminal 748 (e.g., input terminal 248, 548, 648, FIGS. 2-6), an output terminal 758 (e.g., output terminal 258, 558, 658, FIGS. 2-6), and a plurality of transistor fingers (e.g., fingers 241, 242, 541, 542, 641, 642, FIGS. 2-6) electrically coupled between the input and output terminals. The output terminal 758 includes at least one output-side output bondpad 754 (e.g., bondpad 254, 554, 654, FIGS. 2-6) and one or more input-side output bondpads 756 (e.g., bondpads 256, 556, 656, FIGS. 2-6), which are electrically connected through a conductive path 855 (e.g., drain contact 255, 555, 655, FIGS. 2-6 or another conductor that is distinct from the drain contact). In the embodiment of FIG. 8, the conductive path 855 includes an elongated drain contact, which overlies an elongated drain region 857 (e.g., drain region 355, FIG. 3) of a transistor finger. The conductive path 855 may be considered to be a conductive "output terminal-to-bondpad structure". The source regions (e.g., source regions 251, FIGS. 2, 3) of the transistor fingers within each transistor die 740, 741 may be electrically coupled through the die 740, 741 (e.g., through TSVs 252, FIGS. 2, 3) to the flange 706 (e.g., to ground), in an embodiment.

The input terminal 748 of each transistor die 740, 741 is coupled through an input impedance matching circuit (e.g., circuit 110, FIG. 1) to an input lead 702, 703, and also is coupled to an input-side harmonic termination circuit (e.g., circuit 130, FIG. 1). Some of the components of the input impedance matching circuits and the input-side harmonic termination circuits may be implemented within IPD assemblies 710, 711. For example, along amplification path 720 (which may be substantially similar to amplification path 721), IPD assembly 710 may include a first capacitor (e.g., capacitor 114, FIG. 1) with a first terminal coupled to a bondpad 718 (corresponding to node 118, FIG. 1) exposed at a top surface of the IPD assembly 710, and a second terminal coupled through the IPD assembly 710 to the flange 706 (e.g., to ground). A first set of bondwires 712 (corresponding to inductive element 112, FIG. 1) may be connected between the input lead 702 and the bondpad 718, and a second set of bondwires (corresponding to inductive element 116, FIG. 1) may be connected between bondpad 718 and a bondpad on the transistor die 740 that corresponds to the input terminal 748 of the transistor die 740. Further, IPD assembly 710 may include a second capacitor (e.g., capacitor 134, FIG. 1) with a first terminal coupled to a bondpad 733 (corresponding to node 133, FIG. 1) exposed at a top surface of the IPD assembly 710, and a second terminal coupled through the IPD assembly 710 to the flange 706 (e.g., to ground). A third set of bondwires 732 (corresponding to inductive element 132, FIG. 1) may be connected between the input terminal 748 of the transistor die 740 and bondpad 733. With reference to FIG. 8, it should be noted that bondwires 716 and 732 are shown with dashed lines, as they are connected to obscured bondpads associated with input terminal 748, and not to bondpad 756 associated with output terminal 758.

As most clearly shown in FIG. 8, the output terminal 758 within each transistor die 740, 741 is coupled through an output impedance matching circuit 860 (e.g., circuit 160, FIG. 1) to an output lead 704, 705. According to an embodiment, the output terminal 758 also is coupled to an output-side harmonic termination circuit 870 (e.g., circuit 170, FIG. 1) and a baseband termination circuit 880 (e.g., circuit 180, FIG. 1).

Various components of output impedance matching circuits 860, output-side harmonic termination circuits 870, and baseband termination circuits 880 may be implemented within IPD assemblies 750, 751. Each IPD assembly 750, 751 includes a base IPD substrate 822 and a build-up structure 824 over the base IPD substrate 822. The base IPD substrate 822 may include any of a variety of semiconductor substrates (e.g., silicon-based, GaN-based, GaAs-based, or other types of substrates). As will be described below, a plurality of passive devices (including capacitors 866, 874, 886, 888, inductor 884, and resistor 882) may be integrally formed in or coupled to the build-up structure 824. To provide connections to ground (e.g., to flange 706) for these passive components, conductive TSVs (e.g., TSV 852) may extend between the top and bottom surfaces of the base IPD substrate 822 to contact a conductive layer 826 on the bottom surface of the IPD assembly 750, 751. Although embodiments of IPD assemblies 750, 751 that include semiconductor substrates are illustrated and described herein, those of skill in the art would understand, based on the description herein, that the semiconductor-based IPD assemblies 750, 751 may be replaced with other types of assemblies (e.g., a low-temperature co-fired ceramic (LTCC) device, a small PCB assembly, and so on).

Along amplification path 720 (which may be substantially similar to amplification path 721), IPD assembly 750 may include a first capacitor 866 (e.g., capacitor 166, FIG. 1) associated with the output impedance matching circuit 860. Capacitor 866 may be a DC blocking capacitor, in an embodiment. The first capacitor 866 has a first terminal coupled to a bondpad 767 (corresponding to node 167, FIG. 1) exposed at a top surface of the IPD assembly 750, and a second terminal coupled through the IPD assembly 750 to the flange 706 (e.g., through conductive layer 826).

Referring also to FIG. 1, the output impedance matching circuit 860 (e.g., circuit 160, FIG. 1) also includes first and second inductive elements in the form of a first set of bondwires 862 (e.g., corresponding to inductive element 162, FIG. 1), and a second set of bondwires 864 (e.g., corresponding to inductive element 164, FIG. 1). The first set of bondwires 862 is electrically coupled between the output terminal 758 and the output lead 704. In the embodiment of FIGS. 7, 8, bondwires 862 more specifically have first ends coupled to output-side output bondpad 754, and second ends coupled to the output lead 704. This connection of bondwires 862 corresponds to connection 163 in FIG. 1. In an alternate embodiment, as depicted in FIG. 9, bondwires 862 may be replaced by bondwires 962, which have first ends coupled to input-side output bondpad 756, and second ends coupled to the output lead 704. This connection of bondwires 962 corresponds to connection 163' in FIG. 1.

The second set of bondwires 864 of the output impedance matching circuit 860 is electrically coupled between the output terminal 758 and bondpad 767. In the embodiment of FIGS. 7, 8, bondwires 864 more specifically have first ends coupled to input-side output bondpad 756, and second ends coupled to bondpad 767. This connection of bondwires 864 corresponds to connection 165 in FIG. 1. In an alternate embodiment, as depicted in FIG. 9, bondwires 864 may be replaced by bondwires 964, which have first ends coupled to output-side output bondpad 754, and second ends coupled to bondpad 767. This connection of bondwires 964 corresponds to connection 165' in FIG. 1.

IPD assembly 750 also may include a second capacitor 874 (e.g., capacitor 174, FIG. 1) associated with the output-side harmonic termination circuit 870. The second capacitor 874 has a first terminal coupled to a bondpad 777 (corresponding to node 177, FIG. 1) exposed at a top surface of the IPD assembly 750, and a second terminal coupled through the IPD assembly 750 to the flange 706 (e.g., through conductive layer 826). Referring also to FIG. 1, the output-side harmonic termination circuit 870 (e.g., circuit 170, FIG. 1) also includes an inductive element in the form of a set of bondwires 872 (e.g., corresponding to inductive element 172, FIG. 1), which is electrically coupled between the output terminal 758 and bondpad 777. In the embodiment of FIGS. 7-9, bondwires 872 more specifically have first ends coupled to output-side output bondpad 754, and second ends coupled to the bondpad 777. This connection of bondwires 872 corresponds to connection 173 in FIG. 1. In an alternate embodiment, bondwires 872 may be replaced by bondwires 872', which have first ends coupled to input-side output bondpad 756, and second ends coupled to bondpad 777. This connection of bondwires 872' corresponds to connection 173' in FIG. 1.

Further, IPD assemblies 750, 751 may include components of a baseband termination circuit 880 (e.g., baseband termination circuit 180, FIG. 1) coupled to an RF cold point node (e.g., to bondpad 767, which corresponds to node 167, FIG. 1). For example, the components of the baseband termination circuit 880 may include an envelope resistor 882 (e.g., resistance 182, FIG. 1), an envelope inductor 884 (e.g., inductance 184, FIG. 1), and an envelope capacitor 888 (e.g., capacitance 188, FIG. 1) electrically coupled in series between bondpad 767 and the flange 706 (i.e., to ground). Further, a bypass capacitor 886 (e.g., capacitance 186, FIG. 1) may be coupled in parallel with the envelope inductor 884. As discussed previously in conjunction with FIG. 1, the configuration of the baseband termination circuit 880 may be different from that depicted in FIGS. 7, 8.

As indicated in the embodiments of amplifier devices 700, 900 in FIGS. 7-9, the inclusion of a transistor output terminal 758 (e.g., output terminal 158, 258, 558, 658, FIGS. 1-6) that has both an output-side output terminal 754 (e.g., terminal 154, 254, 554, 654, FIGS. 1-6) and one or more input-side output terminals 756 (e.g., terminals 156, 256, 556, 656, FIGS. 1-6) enables a variety of different circuit configurations that may have reduced electromagnetic coupling, reduced amplifier footprints, and/or other advantages, when compared with conventional amplifier devices. More specifically, as indicated most clearly by comparing FIGS. 8 and 9, bondwire arrays 862, 962 corresponding to inductive element 162 (FIG. 1) may be connected between an output lead 704 and either the output-side output terminal 754 (as in FIG. 8) or the input-side output terminals 756 (as in FIG. 9). In addition, bondwire arrays 864, 964 corresponding to inductive element 164 (FIG. 1) may be connected between a bondpad 767 (corresponding to connection node 167, FIG. 1) and either the input-side output terminals 756 (as in FIG. 8) or the output-side output terminal 754 (as in FIG. 9). Further still, bondwire arrays 872, 872' corresponding to inductive element 172 (FIG. 1) may be connected between a bondpad 777 (corresponding to connection node 177, FIG. 1) and either the output-side output terminal 754 (as in the case of bondwire array 872) or the input-side output terminals 756 (as in the case of bondwire array 872').

Figure 10:
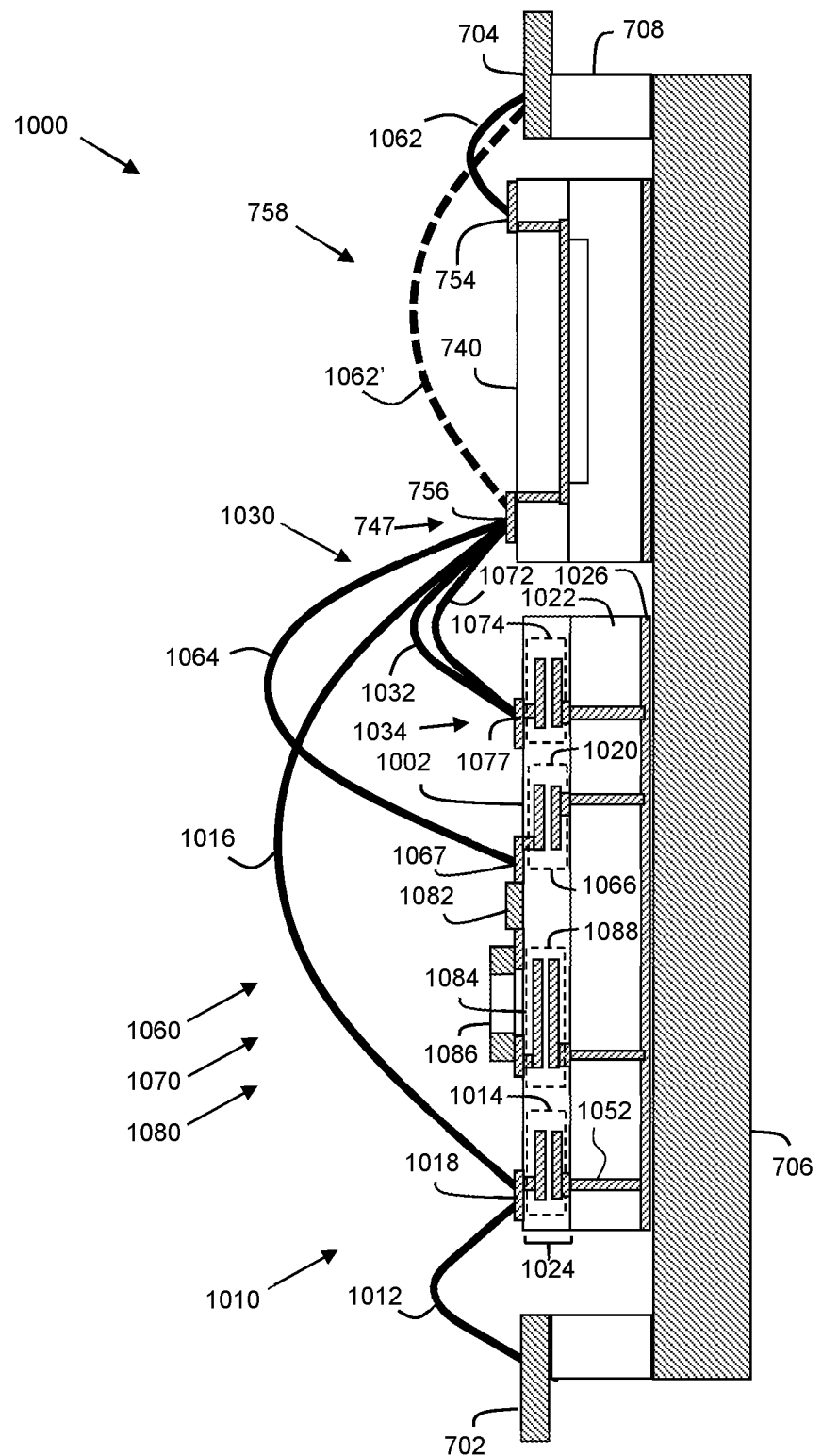
FIG. 10 is a cross-sectional, side view of a packaged RF power amplifier device, including a power transistor die and an input-side integrated passive device (IPD) that includes portions of both input and output circuits, in accordance with yet another example embodiment.

Further the inclusion of a transistor output terminal that has one or more input-side output terminals also may enable portions of the output circuit to be moved to the input side of an amplifier device, module, or system. For example, FIG. 10 is a cross-sectional, side view of a packaged RF power amplifier device 1000, including a power transistor die 740 and an input-side IPD assembly 1002 that includes portions of both input and output circuits, in accordance with yet another example embodiment. The power amplifier device 1000 of FIG. 10 has some similarities to the device 700 of FIG. 7, and to the extent that certain features are substantially similar or identical, the same reference numbers are used. For example, as with device 700 (FIG. 7), device 1000 also includes a device package with a conductive flange 706, an isolation structure 708, one or more input leads 702, and one or more output leads 704. For the purpose of brevity, the details of flange 706, isolation structure 708, and leads 702, 704 discussed above in conjunction with FIG. 7 will not be repeated here, but those details are intended to be incorporated into this description of the device 1000 of FIG. 10.

Also similar to device 700 (FIG. 7), for each amplification path, device 1000 also includes an IPD assembly 1010 and a power transistor die 740 coupled to the flange 706 between the input and output leads 702, 704. The power transistor die 740 may be substantially similar or identical to the power transistor die 740 illustrated and described in conjunction with FIGS. 7-9 (and thus may correspond to any of the embodiments of power transistor dies 200, 500, 600, FIGS. 2-6). For the purpose of brevity, the details of power transistor die 740 (and the details of power transistor dies 200, 500, 600) discussed above will not be repeated here, but those details are intended to be incorporated into this description of the device 1000 of FIG. 10.

Unlike the device 700 (FIG. 7), device 1000 does not include a second IPD assembly between the power transistor die 740 and the output lead 704. Instead, as will be described in more detail below, the circuitry associated with both IPD assemblies 710 and 750 (FIG. 7) is integrated within a single IPD assembly 1002 that is positioned between the input lead 702 and the power transistor die 740.

More specifically, IPD assembly 1002 includes various components of an input impedance matching circuit 1010 (e.g., circuit 110, FIG. 1), an input-side harmonic termination circuit 1030 (e.g., circuit 130, FIG. 1), an output impedance matching circuit 1060 (e.g., circuit 160, FIG. 1), an output-side harmonic termination circuit 1070 (e.g., circuit 170, FIG. 1), and a baseband termination circuit 1080 (e.g., circuit 180, FIG. 1). IPD assembly 1002 includes a base IPD substrate 1022 and a build-up structure 1024 over the base IPD substrate 1022. The base IPD substrate 1022 may include any of a variety of semiconductor substrates (e.g., silicon-based, GaN-based, GaAs-based, or other types of substrates). As will be described below, a plurality of passive devices (including capacitors 1014, 1066, 1074, 1086, 1088, inductor 1084, and resistor 1082) may be integrally formed in or coupled to the build-up structure 1024. To provide connections to ground (e.g., to flange 706) for these passive components, conductive TSVs (e.g., TSV 1052) may extend between the top and bottom surfaces of the base IPD substrate 1022 to contact a conductive layer 1026 on the bottom surface of the IPD assembly 1002. Although embodiments of an IPD assembly 1002 that includes a semiconductor substrate is illustrated and described herein, those of skill in the art would understand, based on the description herein, that the semiconductor-based IPD assembly 1022 may be replaced with another type of assembly (e.g., an LTCC device, a small PCB assembly, and so on).

According to an embodiment, IPD assembly 1002 may include a first capacitor 1014 (e.g., capacitor 114, FIG. 1) associated with the input impedance matching circuit 1010. The first capacitor 1014 has a first terminal coupled to a bondpad 1018 (corresponding to node 118, FIG. 1) exposed at a top surface of the IPD assembly 1002, and a second terminal coupled through the IPD assembly 1002 to the flange 706 (e.g., through conductive layer 1026).

Referring also to FIG. 1, the input impedance matching circuit 1010 (e.g., circuit 110, FIG. 1) also includes first and second inductive elements in the form of a first set of bondwires 1012 (e.g., corresponding to inductive element 112, FIG. 1), and a second set of bondwires 1016 (e.g., corresponding to inductive element 116, FIG. 1). The first set of bondwires 1012 is electrically coupled between the input lead 702 and bondpad 1018, and the second set of bondwires 1016 is electrically coupled between bondpad 1018 and an input bondpad 747 (e.g., bondpad 247, 547, 647, which is hidden behind bondpad 756 in FIG. 10) of transistor die 750.

In addition, IPD assembly 1002 may include a second capacitor 1066 (e.g., capacitor 166, FIG. 1) associated with the output impedance matching circuit 1060. Capacitor 1066 may be a DC blocking capacitor, in an embodiment. The second capacitor 1066 has a first terminal coupled to a bondpad 1067 (corresponding to node 167, FIG. 1) exposed at a top surface of the IPD assembly 1002, and a second terminal coupled through the IPD assembly 1002 to the flange 706 (e.g., through conductive layer 1026). The output impedance matching circuit 1060 (e.g., circuit 160, FIG. 1) also includes first and second inductive elements in the form of a third set of bondwires 1062 (e.g., corresponding to inductive element 162, FIG. 1), and a fourth set of bondwires 1064 (e.g., corresponding to inductive element 164, FIG. 1). The third set of bondwires 1062 is electrically coupled between the output terminal 758 and the output lead 704. In the embodiment of FIG. 10, bondwires 1062 more specifically have first ends coupled to output-side output bondpad 754, and second ends coupled to the output lead 704. This connection of bondwires 1062 corresponds to connection 163 in FIG. 1. In an alternate embodiment, bondwires 1062 may be replaced by bondwires 1062', which have first ends coupled to input-side output bondpad 756, and second ends coupled to the output lead 704. This connection of bondwires 1062' corresponds to connection 163' in FIG. 1. In this latter embodiment, output-side output bondpad 754 may be replaced with a simple conductive structure in the build-up structure of the transistor die 740, and the bondpad 754 need not be exposed at the top surface of the transistor die 740.

The fourth set of bondwires 1064 of the output impedance matching circuit 1060 are electrically coupled between the output terminal 758 and bondpad 1067. In the embodiment of FIG. 10, bondwires 1064 more specifically have first ends coupled to input-side output bondpad 756, and second ends coupled to bondpad 1067. This connection of bondwires 1064 corresponds to connection 165 in FIG. 1. In an alternate embodiment, as depicted in FIG. 9, bondwires 1064 may be replaced by bondwires (not shown), which have first ends coupled to output-side output bondpad 754, and second ends coupled to bondpad 1067. This connection of bondwires would correspond to connection 165' in FIG. 1.

IPD assembly 1002 also may include a third capacitor 1034 (e.g., capacitor 134, FIG. 1, which is hidden behind capacitor 1074 in FIG. 10) associated with the input-side harmonic termination circuit 1030. The third capacitor 1034 has a first terminal coupled to a hidden bondpad (corresponding to node 133, FIG. 1) exposed at a top surface of the IPD assembly 1002, and a second terminal coupled through the IPD assembly 1002 to the flange 706 (e.g., through conductive layer 1026). Referring also to FIG. 1, the input-side harmonic termination circuit 1030 (e.g., circuit 130, FIG. 1) also includes an inductive element in the form of a set of bondwires 1032 (e.g., corresponding to inductive element 132, FIG. 1), which are electrically coupled between the transistor input terminal 747 and the hidden bondpad coupled to the third capacitor 1034.

IPD assembly 1002 also may include a fourth capacitor 1074 (e.g., capacitor 174, FIG. 1) associated with the output-side harmonic termination circuit 1070. The third capacitor 1074 has a first terminal coupled to a bondpad 1077 (corresponding to node 177, FIG. 1) exposed at a top surface of the IPD assembly 1002, and a second terminal coupled through the IPD assembly 1002 to the flange 706 (e.g., through conductive layer 1026). Referring also to FIG. 1, the output-side harmonic termination circuit 1070 (e.g., circuit 170, FIG. 1) also includes an inductive element in the form of a set of bondwires 1072 (e.g., corresponding to inductive element 172, FIG. 1), which are electrically coupled between the output terminal 758 and bondpad 1077. In the embodiment of FIG. 10, bondwires 1072 more specifically have first ends coupled to input-side output bondpad 756, and second ends coupled to the bondpad 1077. This connection of bondwires 1072 corresponds to connection 173' in FIG. 1. In an alternate embodiment, bondwires 1072 may instead have first ends coupled to output-side output bondpad 754, and second ends coupled to bondpad 1077. This connection of bondwires corresponds to connection 173 in FIG. 1.

Further, IPD assembly 1002 may include components of a baseband termination circuit 1080 (e.g., baseband termination circuit 180, FIG. 1) coupled to an RF cold point node (e.g., to bondpad 1067, which corresponds to node 167, FIG. 1). For example, the components of the baseband termination circuit 1080 may include an envelope resistor 1082 (e.g., resistance 182, FIG. 1), an envelope inductor 1084 (e.g., inductance 184, FIG. 1), and an envelope capacitor 1088 (e.g., capacitance 188, FIG. 1) electrically coupled in series between bondpad 1067 and the flange 706 (i.e., to ground). Further, a bypass capacitor 1086 (e.g., capacitance 186, FIG. 1) may be coupled in parallel with the envelope inductor 1084. As discussed previously in conjunction with FIG. 1, the configuration of the baseband termination circuit 1080 may be different from that depicted in FIG. 10.

The embodiment of FIG. 10 illustrates that the configuration of the output terminal 758 of the transistor die 740 enables all of the passive devices associated with both the input and output circuits to be moved to the input-side of the device 1000 (i.e., between the input lead 702 and the transistor die 740. This further enables an output-side IPD to be excluded from the device 1000. This potentially results in a more compact device 1000, in comparison with device 700 (FIG. 7). In addition, the relatively short output bondwires 1062 between the output-side output bondpad 754 and the output lead 704 may have significantly less inductance than bondwires that would need to extend over an output-side IPD. This may have additional benefits in terms of amplifier performance.

The amplifier 100, power transistor dies 200, 500, 600, and/or devices 700, 1000 previously described may be incorporated into a larger amplification system. For example, the amplifier 100, power transistor dies 200, 500, 600, and/or devices 700, 1000 may be incorporated into a Doherty power amplifier, or another type of single-path or multiple-path amplifier.

Figure 11:
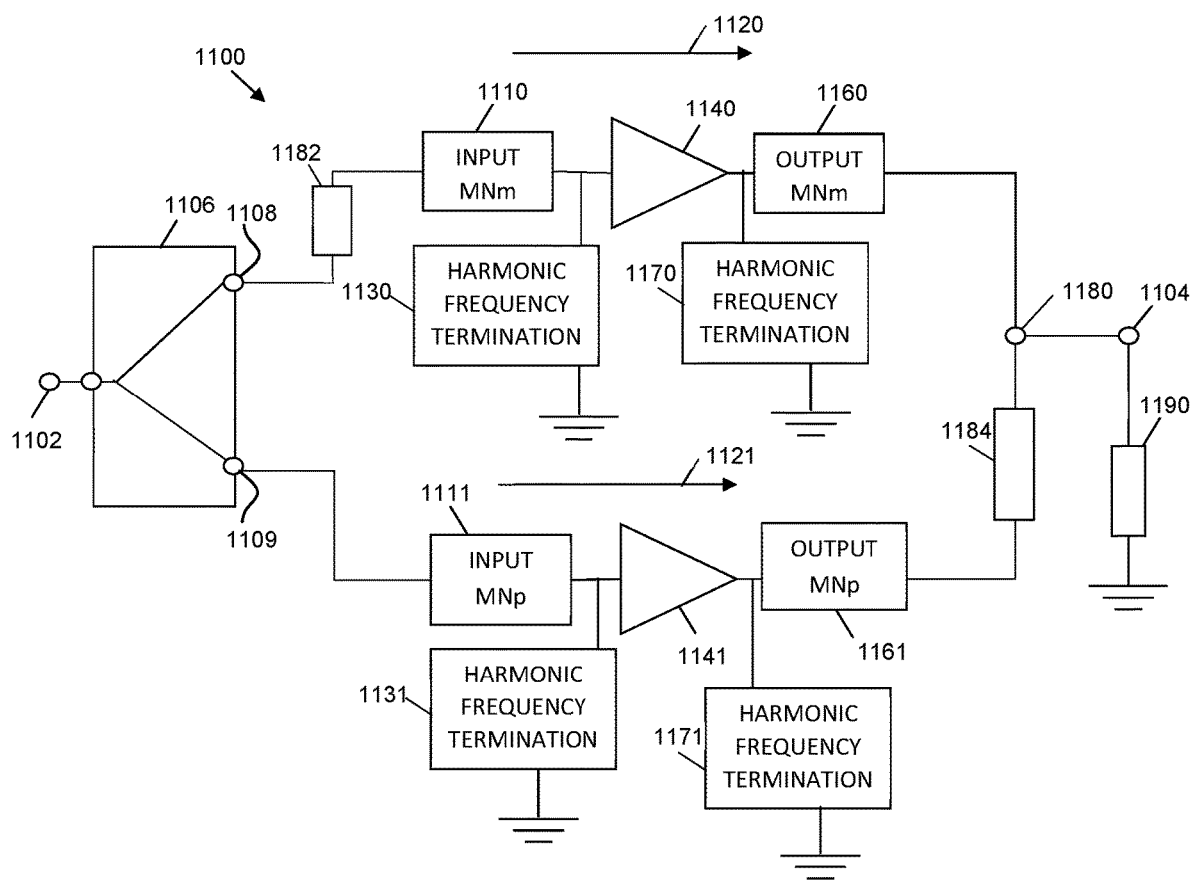
FIG. 11 is a simplified schematic diagram of a Doherty power amplifier, in accordance with an example embodiment.

For example, FIG. 11 is a simplified schematic diagram of a Doherty power amplifier 1100 in which embodiments of power amplifier circuit 100, power transistor dies 200, 500, 600, and/or devices 700, 1000 (FIGS. 1-10) may be implemented. Amplifier 1100 includes an input node 1102, an output node 1104, a power divider 1106 (or splitter), a main amplifier path 1120, a peaking amplifier path 1121, and a combining node 1180. A load 1190 may be coupled to the combining node 1180 (e.g., through an impedance transformer, not shown) to receive an amplified RF signal from amplifier 1100.

Power divider 1106 is configured to divide the power of an input RF signal received at input node 1102 into main and peaking portions of the input signal. The main input signal is provided to the main amplifier path 1120 at power divider output 1108, and the peaking input signal is provided to the peaking amplifier path 1121 at power divider output 1109. During operation in a full-power mode when both the main and peaking amplifier paths 1120, 1121 are supplying current to the load 1190, the power divider 1106 divides the input signal power between the amplifier paths 1120, 1121. For example, the power divider 1106 may divide the power equally, such that roughly one half of the input signal power is provided to each path 1120, 1121 (e.g., for a symmetric Doherty amplifier configuration). Alternatively, the power divider 1106 may divide the power unequally (e.g., for an asymmetric Doherty amplifier configuration).

Essentially, the power divider 1106 divides an input RF signal supplied at the input node 1102, and the divided signals are separately amplified along the main and peaking amplifier paths 1120, 1121. The amplified signals are then combined in phase at the combining node 1180.

Phase coherency between the main and peaking amplifier paths 1120, 1121 is maintained across a frequency band of interest to ensure that the amplified main and peaking signals arrive in phase at the combining node 1180, and thus to ensure proper Doherty amplifier operation. More specifically, Doherty amplifier 1100 has an "inverted" load network configuration. In the inverted configuration, the input circuit is configured so that an input signal supplied to the main amplifier 1140 is delayed by 90 degrees with respect to the input signal supplied to the peaking amplifier 1141 at the center frequency of operation, f0, of the amplifier 1100. To ensure that the main and peaking input RF signals arrive at the main and peaking amplifiers 1140, 1141 with about 90 degrees of phase difference, as is fundamental to proper Doherty amplifier operation, phase delay element 1182 applies about 90 degrees of phase delay to the main input signal. For example, phase delay element 1182 may include a quarter wave transmission line, or another suitable type of delay element with an electrical length of about 90 degrees. Phase delay element 1182 applies the 90 degree phase delay difference between the main and peaking amplifier paths 1120, 1121 at the inputs of amplifiers 1140, 1141 in order to compensate for a 90 degree phase delay applied to the signal between the output of peaking amplifier 1141 and the combining node 1180. This is achieved through an additional delay element 1184.

The main amplification path 1120 includes an input matching network (MNm) 1110, a main amplifier 1140, an output matching network (MNm) 1160, and both input-side and output-side harmonic frequency termination circuits 1130, 1170. Similarly, the peaking amplification path 1121 includes an input matching network (MNm) 1111, a peaking amplifier 1141, an output matching network (MNm) 1161, and both input-side and output-side harmonic frequency termination circuits 1131, 1171. Baseband termination circuits (e.g., baseband termination circuit 180, FIG. 1) may be included in each of the main and peaking amplification paths 1120, 1121, as well, in some embodiments.

Components of the main and peaking amplifier paths 1120, 1121 will now be correlated with the previously-described embodiments of power amplifier circuit 100, power transistor dies 200, 500, 600, and/or devices 700, 1000 (FIGS. 1-10). For example, the main amplification path 1120 may include a first instance of amplifier circuit 100, and the peaking amplification path 1121 may include a second instance of amplifier circuit 100. More specifically, input matching networks 1110, 1111 may correspond to two instances of input matching network 110 or 1010 (FIGS. 1, 10), the main and peaking amplifiers 1140, 1141 may correspond to two instances of transistor die 140, 200, 500, 600, or 740 (FIGS. 1-10), output matching networks 1160, 1161 may correspond to two instances of output matching network 160, 860 or 1060 (FIGS. 1, 7-10), input-side harmonic frequency termination circuits 1130, 1131 may correspond to two instances of harmonic frequency termination circuit 130 or 1030 (FIGS. 1, 10), and output-side harmonic frequency termination circuits 1170, 1171 may correspond to two instances of harmonic frequency termination circuit 170, 870 or 1070 (FIGS. 1, 7-10). Since device 700 includes two amplification paths 720, 721, device 700 could be used to provide all of the input matching networks 1110, 1111, amplifiers 1140, 1141, output matching networks 1160, 1161, and harmonic frequency termination circuits 1130, 1131, 1170, 1171, along with baseband termination circuits (not illustrated in FIG. 11).

During operation of Doherty amplifier 1100, the main amplifier 1140 is biased to operate in class AB mode, and the peaking amplifier 1141 is biased to operate in class C mode. At low power levels, where the power of the input signal at node 1102 is lower than the turn-on threshold level of peaking amplifier 1141, the amplifier 1100 operates in a low-power (or back-off) mode in which the main amplifier 1140 is the only amplifier supplying current to the load 1190. When the power of the input signal exceeds a threshold level of the peaking amplifier 1141, the amplifier 1100 operates in a high-power mode in which the main amplifier 1140 and the peaking amplifier 1141 both supply current to the load 1190. At this point, the peaking amplifier 1141 provides active load modulation at combining node 1180, allowing the current of the main amplifier 1140 to continue to increase linearly.

Those of skill in the art would understand that the amplifier embodiments described herein may be used in other amplifier topologies besides Doherty amplifier topologies. Although such alternatives are not discussed in detail herein, embodiments that include such modifications are intended to fall within the scope of the inventive subject matter.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power transistor die comprising:
   a semiconductor die with an input die side and an opposed output die side;
   a transistor integrally formed in the semiconductor die between the input die side and the output die side, wherein the transistor has an input and an output;
   a plurality of input bondpads integrally formed in the semiconductor die between the input die side and the transistor, wherein the plurality of input bondpads is electrically connected to the input of the transistor;
   a first output bondpad integrally formed in the semiconductor die between the input die side and the transistor, wherein the first output bondpad is positioned between two input bondpads of the plurality of input bondpads; and
   a conductive structure integrally formed in the semiconductor die that directly electrically connects the output of the transistor to the first output bondpad.

2. The power transistor die of claim 1, further comprising:
   a second output bondpad integrally formed in the semiconductor die between the transistor and the output die side, wherein the second output bondpad is directly electrically connected to the output.

3. The power amplifier die of claim 1, wherein the transistor is a field effect transistor, and wherein
   the input is a gate of the field effect transistor;
   the output is a drain region of the field effect transistor; and
   the conductive structure includes an elongated drain contact overlying the drain region, wherein an input-side end of the elongated drain contact is electrically connected to the first output bondpad.

4. A field effect transistor comprising:
   a semiconductor die with an input die side and an opposed output die side, wherein the semiconductor die includes a base semiconductor substrate and a build-up structure over a top surface of the base semiconductor substrate;
   a first transistor finger integrally formed in the semiconductor die between the input die side and the output die side, wherein the first transistor finger includes
      a first gate extending in a first direction from the input die side toward the output die side and overlying a first channel region in the base semiconductor substrate, wherein the first gate has a first gate end proximate to the input die side, a second gate end proximate to the output die side, and first and second gate sides extending between the first and second gate ends, a first drain region in the base semiconductor substrate and extending in the first direction, wherein the first drain region is located adjacent to the first gate side, and a first drain contact overlying the first drain region and extending in the first direction, wherein the first drain contact has a first drain contact end proximate to the input die side, and a second drain contact end proximate to the output die side;

a first gate bondpad electrically connected to the first gate, wherein the first gate bondpad is integrally formed in the build-up structure between the input die side and the first transistor finger; and a first input-side drain bondpad directly electrically connected to the first drain contact, wherein the first input-side drain bondpad is integrally formed in the build-up structure between the input die side and the first transistor finger.

5. The field effect transistor of claim 4, wherein the first input-side drain bondpad is directly connected to the first drain contact end through conductive structures that are integrally formed in the semiconductor die.

6. The field effect transistor of claim 4, further comprising:

an output-side drain bondpad directly connected to the second drain contact end, wherein the output-side drain bondpad is integrally formed in the build-up structure between the first transistor finger and the output die side.

7. The field effect transistor of claim 6, further comprising:

a second transistor finger integrally formed in the semiconductor die between the input die side and the output die side, wherein the second transistor finger includes
a second gate extending in the first direction and overlying a second channel region in the base semiconductor substrate,
a second drain region extending in the first direction, wherein the second drain region is located adjacent to the second gate, and
a second drain contact overlying the second drain region and extending in the first direction, wherein the second drain contact is directly connected to the output-side drain bondpad.

8. The field effect transistor of claim 4, further comprising:

a plurality of additional transistor fingers arranged in parallel with the first transistor finger, wherein the plurality of additional transistor fingers includes a plurality of additional gates, a plurality of additional drain regions, and a plurality of additional drain contacts.

9. The field effect transistor of claim 8, further comprising:

a plurality of additional gate bondpads, each integrally formed in the semiconductor die and electrically connected to one or more of the plurality of additional gates; and a plurality of additional input-side drain bondpads, each directly electrically connected to one or more of the additional drain contacts, wherein the plurality of additional input-side drain bondpads are formed in the build-up structure between the input die side and the plurality of additional transistor fingers.

10. The field effect transistor of claim 9, wherein the first and additional gate bondpads are positioned in an alternating arrangement with the first and additional input-side drain bondpads.

11. The field effect transistor of claim 8, further comprising:

a conductive input runner electrically coupled to the first gate bondpad, the first gate, and the plurality of additional gates, wherein the conductive input runner is positioned between the first gate bondpad and the first gate finger; and a plurality of additional gate bondpads, each integrally formed in the semiconductor die and electrically connected to the conductive input runner.

12. The field effect transistor of claim 11, further comprising:

a plurality of additional input-side drain bondpads each directly electrically connected to one or more of the additional drain contacts, wherein the plurality of additional input-side drain bondpads are formed in the semiconductor build-up structure between the input die side and the plurality of additional transistor fingers.

13. The field effect transistor of claim 4, further comprising:

a source region in the base semiconductor substrate and extending in the first direction, wherein the source region is located adjacent to the second gate side, and the source region is electrically coupled to a conductive layer on a bottom surface of the semiconductor die.

14. The field effect transistor of claim 13, further comprising:

a second transistor finger integrally formed in the semiconductor die between the input die side and the output die side, wherein the first transistor finger is located at a first side of the source region, the second transistor finger is located at a second side of the source region, and the second transistor finger includes
a second gate extending in the first direction and overlying a second channel region in the base semiconductor substrate, wherein the second gate is electrically connected to the first gate bondpad,
a second drain region extending in the first direction, wherein the second drain region is located adjacent to the second gate, and
a second drain contact overlying the second drain region and extending in the first direction; and a second input-side drain bondpad directly electrically connected to the second drain contact, wherein the second input-side drain bondpad is formed in the build-up structure between the input die side and the second transistor finger, and the first gate bondpad is located between the first and second input-side drain bondpads.

15. A power amplifier comprising:

an amplifier substrate;

an amplifier input coupled to the amplifier substrate;

an amplifier output coupled to the amplifier substrate;

a transistor die coupled to the amplifier substrate, wherein the transistor die includes a semiconductor die with an input die side and an opposed output die side,
a transistor integrally formed in the semiconductor die between the input die side and the output die side, wherein the transistor has an input and an output,
a plurality of input bondpads integrally formed in the semiconductor die between the input die side and the transistor, wherein the plurality of input bondpads is electrically connected to the input of the transistor, a first output bondpad integrally formed in the semiconductor die between the input die side and the transistor, wherein the first output bondpad is positioned between two input bondpads of the plurality of input bondpads, and a conductive structure integrally formed in the semiconductor die that directly electrically connects the output of the transistor to the first output bondpad; and an output circuit electrically coupled between the transistor and the amplifier output, wherein the output circuit includes at least one first bondwire coupled to the first output bondpad.

16. The power amplifier of claim 15, wherein:
the at least one first bondwire comprises a plurality of bondwires with first ends connected to the first output bondpad, and second ends connected to the amplifier output.

17. The power amplifier of claim 15, wherein:
the output circuit includes at least one passive device that is coupled to the amplifier substrate; and
the at least one first bondwire comprises a plurality of bondwires with first ends connected to the first output bondpad, and second ends connected to the at least one passive device.

18. The power amplifier of claim 17, wherein the at least one passive device is coupled to the amplifier substrate between the transistor die and the amplifier output.

19. The power amplifier of claim 17, wherein the at least one passive device is coupled to the amplifier substrate between the transistor die and the amplifier input.

20. The power amplifier of claim 15, wherein:
the transistor die further includes a second output bondpad integrally formed in the semiconductor die between the transistor and the output die side; and
the output circuit includes at least one passive device, which is coupled to the amplifier substrate, and at least one second bondwire coupled to the second output bondpad.

21. The power amplifier of claim 20, wherein:
the at least one first bondwire comprises a plurality of first bondwires with first ends connected to the first output bondpad, and second ends connected to the at least one passive device; and
the at least one second bondwire comprises a plurality of second bondwires with first ends connected to the second output bondpad, and second ends connected to the amplifier output.

22. The power amplifier of claim 20, wherein:
the at least one first bondwire comprises a plurality of first bondwires with first ends connected to the first output bondpad, and second ends connected to the amplifier output; and
the at least one second bondwire comprises a plurality of second bondwires with first ends connected to the second output bondpad, and second ends connected to the at least one passive device.

23. The power amplifier of claim 15, wherein the output circuit further includes a capacitor with a first terminal coupled to the at least one first bondwire, and a second terminal electrically coupled to a ground reference node, wherein the capacitor is a DC blocking capacitor.

24. The power amplifier of claim 23, further comprising:
a baseband termination circuit electrically connected to a connection node between the at least one first bondwire and the capacitor, wherein the baseband termination circuit includes an envelope resistor, an envelope inductor, and an envelope capacitor coupled in series between the connection node and the ground reference node.

25. The power amplifier of claim 15, wherein the output circuit further includes a capacitor with a first terminal coupled to the at least one first bondwire, and a second terminal electrically coupled to a ground reference node, wherein the at least one first bondwire and the capacitor form a series inductor/capacitor (LC) circuit that resonates at or near a second harmonic frequency.

26. A power amplifier comprising:
an amplifier substrate;
an amplifier input coupled to the amplifier substrate;
an amplifier output coupled to the amplifier substrate;
a transistor die coupled to the amplifier substrate, wherein the transistor die includes
a semiconductor die with an input die side and an opposed output die side,
a transistor integrally formed in the semiconductor die between the input die side and the output die side, wherein the transistor has an input and an output,
an input bondpad integrally formed in the semiconductor die between the input die side and the transistor, wherein the input bondpad is electrically connected to the input of the transistor,
a first output bondpad integrally formed in the semiconductor die between the input die side and the transistor, and
a conductive structure integrally formed in the semiconductor die that directly electrically connects the output of the transistor to the first output bondpad;
an output circuit electrically coupled between the transistor and the amplifier output, wherein the output circuit includes at least one first bondwire coupled to the first output bondpad, and wherein the amplifier input, the transistor die, the amplifier output, and the output circuit form portions of a first amplification path;
a second amplification path;
a power divider with a divider input configured to receive a radio frequency (RF) signal, a first divider output coupled to an input of the first amplification path, and a second divider output coupled to an input of the second amplification path, wherein the power divider is configured to divide the RF signal into a first RF signal that is provided to the first amplification path through the first divider output, and into a second RF signal that is provided to the second amplification path through the second divider output; and
a combining node configured to receive and combine amplified RF signals produced by the first and second amplification paths.

27. The power amplifier of claim 26, wherein the power amplifier is a Doherty power amplifier.

* * * * *